(12) United States Patent
DiBello et al.

(10) Patent No.: US 11,736,540 B2
(45) Date of Patent: *Aug. 22, 2023

(54) SYSTEMS AND METHODS FOR ESTABLISHING A VOICE LINK BETWEEN USERS ACCESSING MEDIA

(71) Applicant: Rovi Guides, Inc., San Jose, CA (US)

(72) Inventors: Steve M. DiBello, West Chester, PA (US); Samir Desai, Harleysville, PA (US); Robert Barr Thompson, Broomall, PA (US)

(73) Assignee: Rovi Guides, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/212,487

(22) Filed: Mar. 25, 2021

(65) Prior Publication Data

US 2021/0243235 A1 Aug. 5, 2021

Related U.S. Application Data

(63) Continuation of application No. 15/812,594, filed on Nov. 14, 2017, now Pat. No. 10,992,719.

(51) Int. Cl.
*H03G 3/20* (2006.01)
*H04N 21/485* (2011.01)
(Continued)

(52) U.S. Cl.
CPC .............. *H04L 65/403* (2013.01); *H03G 3/20* (2013.01); *H04L 12/1822* (2013.01);
(Continued)

(58) Field of Classification Search
None
See application file for complete search history.

(56) References Cited

U.S. PATENT DOCUMENTS 6,239,794 B1 5/2001 Yuen et al.
6,564,378 B1 5/2003 Satterfield et al.
(Continued)

FOREIGN PATENT DOCUMENTS

CA 2344595 A1 * 12/2001 ............. H04L 29/06
EP 1773062 A2 4/2007
(Continued)

OTHER PUBLICATIONS

International Search Report and Written Opinion dated Nov. 19, 2018 in PCT/US2018/039536.

*Primary Examiner* — Mohamed Ibrahim
(74) *Attorney, Agent, or Firm* — Haley Guiliano LLP

(57) ABSTRACT

Systems and methods for establishing a voice communications link between multiple users accessing a media asset are provided. A media asset is accessed using a first user device, the first user device being associated with a first user at a first location. A second user who is accessing the media asset using a second user device is identified, wherein the second user is associated with the first user and is at a second location. A voice communications link between the first and second user devices that enables the first and second users to speak to each other while accessing the media asset is established. A volume level of audio received via the voice communications link is set based on content of the media asset, causing the audio received via the voice communications link from the second user to be presented to the first user at the set volume level.

20 Claims, 9 Drawing Sheets

(51) Int. Cl.
  *H04N 21/258*  (2011.01)
  *H04N 21/81*  (2011.01)
  *H04N 21/4722*  (2011.01)
  *H04N 21/4788*  (2011.01)
  *H04N 21/439*  (2011.01)
  *H04L 12/18*  (2006.01)
  *H04L 65/403*  (2022.01)
  *H04L 51/02*  (2022.01)
  *H04N 21/45*  (2011.01)
  *H04N 21/475*  (2011.01)
  *H04N 21/422*  (2011.01)

(52) U.S. Cl.
  CPC ... *H04L 12/1827* (2013.01); *H04N 21/25891* (2013.01); *H04N 21/4394* (2013.01); *H04N 21/4722* (2013.01); *H04N 21/4788* (2013.01); *H04N 21/4852* (2013.01); *H04N 21/8126* (2013.01); *H04L 12/1818* (2013.01); *H04L 51/02* (2013.01); *H04N 21/42203* (2013.01); *H04N 21/4532* (2013.01); *H04N 21/4755* (2013.01)

(56) References Cited

U.S. PATENT DOCUMENTS

| | | | |
|---|---|---|---|
| 6,584,201 B1 * | 6/2003 | Konstantinou | H03G 1/02 |
| | | | 381/104 |
| 7,165,098 B1 | 1/2007 | Boyer et al. | |
| 7,761,892 B2 | 7/2010 | Ellis et al. | |
| 8,046,801 B2 | 10/2011 | Ellis et al. | |
| 8,233,598 B2 | 7/2012 | Katis | |
| 2002/0174430 A1 | 11/2002 | Ellis et al. | |
| 2004/0068750 A1 | 4/2004 | Maa | |
| 2005/0251827 A1 | 11/2005 | Ellis et al. | |
| 2007/0076131 A1 | 4/2007 | Li | |
| 2009/0100489 A1 * | 4/2009 | Strothmann | H04N 5/76 |
| | | | 725/114 |
| 2010/0153885 A1 | 6/2010 | Yates | |
| 2011/0296506 A1 | 12/2011 | Caspi | |
| 2013/0031192 A1 | 1/2013 | Caspi | |
| 2015/0149179 A1 | 5/2015 | Korbecki | |
| 2017/0250852 A9 | 8/2017 | Caspi | |

FOREIGN PATENT DOCUMENTS

| | | |
|---|---|---|
| EP | 3 168 740 | 5/2017 |
| WO | WO 01/50753 | 7/2001 |

\* cited by examiner

600

610
Access a Media Asset Using a First User Device, the First User Device Being Associated with a First User at a First Location

620
Identify a Second User Who is Accessing the Media Asset Using a Second User Device, Wherein the Second User is Associated with the First User and is at a Second Location

630
Establish a Voice Communications Link Between the First and Second User Devices that Enables the First and Second Users to Speak to Each Other While Accessing the Media Asset

640
Set, Based on Content of the Media Asset, a Volume Level of Audio Received via the Voice Communications Link

650
Cause the Audio Received via the Voice Communications Link from the Second User to be Presented to the First User at the Set Volume Level

FIG. 6

SYSTEMS AND METHODS FOR ESTABLISHING A VOICE LINK BETWEEN USERS ACCESSING MEDIA

CROSS REFERENCE TO RELATED APPLICATIONS

This application is a continuation of U.S. patent application Ser. No. 15/812,594, filed Nov. 14, 2017, the disclosure of which is hereby incorporated by reference herein in its entirety.

BACKGROUND

Users often enjoy experiencing media, such as watching a football game on television, with other users. When users are not in the same room or unable to get together, they can use Internet-connected appliances and devices to experience media together. For example, a user can use the Amazon Echo's drop-in feature to connect to a friend so both users can speak to each other while watching the Superbowl in separate locations.

Systems exist to connect users with each other while they consume a media asset, but these systems do not consider the distractions associated with user conversations that can detract from a user's viewing experience. Currently, users must go out of their way to avoid these distractions by manually adjusting the volume of either the audio from the other users they are connected to or the media asset that they are experiencing. Constantly needing to manually adjust volumes or otherwise avoid distractions is inefficient and disrupts the viewing experience and enjoyment of the user.

SUMMARY

Systems and methods for establishing a voice link between users accessing media using a media guidance application are provided. For example, the media guidance application may be implemented on user equipment (e.g., a set-top box, a television, etc.) and/or a voice communications device (e.g., a Google Home device). When a user is watching a basketball game on their television and is connected to their Google Home device, the media guidance application may search through the user's contacts list to identify a second user that is watching the same basketball game on a separate television and is connected to a separate Google Home device. The media guidance application may establish a voice communications link between the two Google Home devices that enables the users to speak to each other while watching the basketball game. Based on the content of the game, the media guidance application may set and adjust the volume level of audio received by each user via the voice communications link. For example, for key plays in the game, the media guidance application may lower the volume of the audio of the voice communications link while maintaining the television volume. Conversely, during commercials or time-outs, the media guidance application may raise the volume of the audio of the voice communications link while maintaining the television volume. This automatic setting of the volume of the voice communications link enables the users to avoid noisy distractions from the game and have a smoother and more enjoyable viewing experience.

In some embodiments, a media asset may be accessed using a first user device, the first user device being associated with a first user at a first location, the first location including a first voice communications device associated with the first user. As an example of these embodiments, a television show may be accessed by a user on their television in their living room, where the user's Google Home device is located.

In some embodiments, the first voice communications device includes an audio output device and the media guidance application may search, with the first user device, a local area network to identify the first voice communications device. The first voice communications device may be selected based on device proximity to the first user device. For example, if the user is streaming media content on their mobile phone, the user's mobile phone may search the local area network and detect the user's Google Home device and Amazon Echo device. The user's Google Home device may be selected as the first voice communications device if it is closer in proximity to the user's mobile phone than the Amazon Echo device.

After identifying the first voice communications device, the media guidance application may send a command to the device that specifies the device's volume level and causes the audio output device of the first voice communications device to change its volume setting to match the specified volume level. For example, the media guidance application may select a specified volume for the device by looking up the volume level of the device when it was most recently connected to the media guidance application. For example, after identifying the first user's Google Home device as the first voice communications device, the media guidance application may query a database that stores information on past device sessions and determine that the volume level of the Google Home device was set at volume "5" when the Google Home device was last connected to by the media guidance application. The media guidance application may send a command to the Google Home specifying that its volume level be set to volume "5", causing the Google Home to set its speaker volume to "5".

The media guidance application may retrieve a contacts list associated with the first user and that includes contact information for each of a plurality of users, wherein the contacts list identifies a plurality of media assets currently being accessed by user devices associated with each of the plurality of users, respectively. For example, the user's Google Home device may iterate through a stored copy of the user's contacts list, which identifies other users' contact information and associated devices, and update each entry of the list with an association to any media asset currently being accessed by that entry's user with their device.

The media guidance application may search the contacts list to identify which of the plurality of media assets corresponds to the media asset that is being accessed using the first user device. For example, the user's Google Home device may, after updating each contact in the user's contacts list with an association to any media assets currently being accessed by the contact, search through the list to identify which contacts are currently accessing the same media asset as the one currently accessed by the user.

The media guidance application may identify, based on searching the contacts list, a second user device associated with a second user that is currently accessing the media asset and is at a second location, the second location including a second voice communications device associated with the second user. For example, given a first user that is viewing a television program in their living room and connected to a Google Home device in that same room, the media guidance application may identify a second user that is viewing the same television program in their dining room and connected to an Amazon Echo device in that same room.

The media guidance application may retrieve contact information associated with the second user from the contacts lists and establish, based on the retrieved contact information, a voice communications link between the first and second voice communications devices that enables the first and second users to speak to each other while accessing the media asset. For example, after identifying that a second user is watching the same television program in the second user's house as the first user is watching in the first user's house, the first user's Google Home device may use the second user's contact information to contact the second user's Amazon Echo device and connect the users over a call.

In some embodiments, the first and second voice communications devices may each include a voice response system that receives verbal commands and responds to the verbal commands audibly. For example, a user may issue a search command, such as "What show is on ABC tonight at 9?", to their voice communications device (e.g., the Google Home device), which may respond audibly by saying the appropriate television show name.

In some embodiments, the media guidance application may receive, with the first voice communications device, a voice command from the first user requesting to communicate with the second user. The media guidance application may transmit a request to the second voice communications device of the second user to authorize the first user to communicate with the second user. For example, if a user named Patricia wishes to call a second user named Scott on her Google Home device, Patricia may prompt the device by saying, "Call Scott." The request may be transmitted to Scott's Amazon Echo device, which may prompt him with the question, "Incoming call from Patricia. Should I accept?" to which Scott can answer "Yes" or "No."

In response to receiving, with the second voice communications device, a voice command from the second user authorizing the first user to communicate with the second user, the media guidance application may form a real-time connection between the first voice communications device and the second voice communications device, wherein using the real-time connection the first voice communications device continuously transmits to the second voice communications device audio detected by a microphone of the first voice communications device, and wherein using the real-time connection the second voice communications device continuously transmits to the first voice communications device audio detected by a microphone of the second voice communications device. For example, if Scott says "Yes" to an incoming call from Patricia, his Amazon Echo device and Patricia's Google Home device may establish a real-time connection between Scott and Patricia that involves both devices continuously listening for audio and transmitting it to the other device, allowing the users to speak to each other in real-time.

In some embodiments, the media guidance application may retrieve contact information associated with a first user and establish a connection using this contact information when a specified command is received from the first user. For example, if a first user issues the verbal command, "Call Tom if he's watching the Superbowl," the media guidance application may search the first user's contacts list for the specified contact Tom and determine whether the contact is accessing the media asset indicated by the first user. After determining this, the media guidance application may establish a voice connection between the first user and the specified user Tom.

In some embodiments, the media guidance application may attempt to establish a connection with all users on the contacts list accessing the same media content as the first user. The media guidance application may do this automatically or in response to a verbal prompt from the user. For example, the media guidance application may, after identifying from the first user's contacts list other users that are accessing the same media content as the first user, automatically transmit voice communications requests to these other users to establish a voice communications link.

The media guidance application may direct the audio received via a voice communications link to the audio output device at the first location. For example, if two users are connected over a call between their respective Google Home devices, the audio received by the first user's Google Home via the voice communications link may be directed to the Google Home's speakers.

In some embodiments, the media guidance application may adjust the volume of the audio received via the voice communications link and outputted at the audio output device based on speaker volume. For example, given three users that are connected via a voice communications link, the media guidance application may detect that the audio received by the first user's voice communications device is at a lower volume level than some threshold. This may be due to the first user being a soft speaker, the first user being far away from the microphone of the voice communications device, or another reason. The media guidance application may determine, if the volume of the audio received by the first user's voice communications device is less than a threshold volume level, that the volume of the audio outputted at the audio output devices of the second and third users' voice communications devices should be increased. Similarly, the media guidance application may detect that the audio received by the second user's voice communications device is at a higher volume level than some threshold. This may be due to the second user being a loud speaker, the second user being close in proximity to the microphone of the voice communications device, or another reason. The media guidance application may determine, if the volume of the audio received by the second user's voice communications device is greater than a threshold volume level, that the volume of the audio outputted at the audio output device of the first and third users' voice communications devices should be decreased.

In some embodiments, accessing the media asset using the first user device causes the audio of the media asset to be presented at a given volume level. The media guidance application may change the volume level of the audio received via the voice communications link from the second voice communications device and maintain the volume of the audio of the media asset at the given volume level while the volume level of audio received via the voice communications link is changed. For example, if a user is watching a television program on their television and connected on their Google Home device to a voice communications link with another user, the media guidance application may adjust the volume level of the voice communications link audio outputted by the Google Home's speakers while maintaining the volume of the audio of the television show being played on the user's television.

In some embodiments, the media guidance application may process metadata associated with the media asset to determine a first content attribute of a plurality of content attributes that is associated with content of the media asset currently being displayed to the first user. The media guidance application may process metadata associated with the media asset before a voice communications link is established, after a voice communications link is established, and/or in the process of establishing a voice communications link, e.g., when a communications request is received by one user device from another. For example, the application may use speech recognition and processing to identify keywords in the audio of a television show and use predictive machine learning algorithms to select the most relevant content-identifying keyword as the first content attribute.

In some embodiments, while the media guidance application is processing metadata, it may detect keywords in speech being exchanged by the first and second users over the voice communications link and compare the keywords to the words associated with the plurality of content attributes to identify a word associated with the first content attribute. This may be done to verify the media guidance application's identification of the content attributes. This may also be done to gauge level of user engagement with the content. The media guidance application may increase the volume of the voice communications link if a value indicating the level of engagement and/or relevance of the user conversation to the content material is determined to be above a certain threshold, or decrease the volume of the voice communications link if this value is determined to be below the threshold. For example, if the first content attribute indicates that the content is a sporting event, the media guidance application may identify keywords in the conversation between the first and second user such as "touchdown" and "yard" and compare these keywords to the content attributes. This may verify that the content is a football game. This may also allow the media guidance application to determine that the users' conversation is engaged with and relevant to the game, and accordingly increase the volume of the voice communications link.

The media guidance application may set, based on the first content attribute associated with the content currently being displayed to the first user, a volume level of audio received by the first voice communications device via the voice communications link, causing the audio received by the first voice communications device via the voice communications link from the second voice communications device to be presented to the first user at the set volume level. For example, the media guidance application may determine changes to the volume level of the voice communications device based on whether the first content attribute indicates at least one of a spoiler segment of the media asset and a non-commercial segment. For example, if the first content attribute indicates that the content currently being displayed to the first user is part of a commercial break during a television program, the volume level of the call between the two users on the first user's Google Home device may be increased and therefore become louder to the first user.

In some embodiments, the media guidance application may search a database of volume levels associated with content attributes to identify a first volume level associated with the first content attribute. In such cases, setting the volume level causes the volume level to be adjusted to the identified first volume level. For example, if a user is connected to a call on their Google Home device and viewing a television program, with the first content attribute of the program indicating that the content is within the action genre, the application may query a database that indicates that the volume level of the television should be in the upper middle range (e.g., "13" on a volume scale of 1-20) and the volume level of the Google Home device should be relatively high (e.g., "8" on a volume scale of 1-10), with the reasoning that action content is generally viewed at moderate to loud volumes and the volume of a voice communications link must accordingly be loud for a user to hear it over the action content.

In some embodiments, after processing metadata associated with the media asset to determine a first content attribute associated with the content currently being displayed to the user, the media guidance application may compare the first content attribute to a profile of the first user to determine an interest level associated with the currently displayed content. For example, if the first content attribute indicates that the content falls under the genre of comedy, the user's Google Home device may look up a user profile that ranks the user's genre preferences and generate an interest level that indicates the level of preference the user has for comedic content.

In response to determining that the interest level is above a threshold, the media guidance application may decrease the volume level of the audio received via the voice communications link. In response to determining that the interest level is below the threshold, the media guidance application may increase the volume level of the audio received via the voice communications link. For example, the threshold may be set by default to a numeric value within a range and adjusted manually by the user via an application user interface. If the user is watching a television show and their interest level is determined to be below the default or user-determined threshold value, the volume of the voice communications link on the user's Google Home device may be increased. Conversely, if the user's interest level in the television show is determined to be above the default or user-determined threshold value, the volume of the voice communications link on the user's Google Home device may be decreased.

In some embodiments, the media asset may be a sporting event. In such cases, the first content attribute represents a scoring metric indicating the likelihood of an upcoming scoring event in the sporting event. The media guidance application may, in response to determining that the scoring metric is above a threshold, decrease the volume level of the audio received via the voice communications link. In response to determining that the scoring metric is below the threshold, the media guidance application may increase the volume level of the audio received via the voice communications link. For example, if the user is viewing a football game, a scoring metric that indicates the likelihood of an upcoming touchdown within the next few minutes may be determined based on the commentary of the sports announcers. If this metric is above the scoring metric threshold set by the system or the user, the volume of the voice communications link on the user's Google Home device may be decreased. If the metric is below the scoring metric threshold, the volume of the voice communications link on the user's Google Home device may be increased.

In some embodiments, the first content attribute indicates at least one of a spoiler segment of the media asset and a non-commercial segment. In such cases, the media guidance application may decrease the volume level of the audio received via the voice communications during at least one of the spoiler segment of the media asset and the non-commercial segment. For example, if the user is watching a television program, the volume of the call with another user on the first user's Google Home device may be decreased when the television program is not currently playing a commercial break. Similarly, the volume of the call on the Google Home device may be decreased when there is a preview of the next episode of the television show.

It should be noted that the systems, methods, apparatuses, and/or aspects described above may be applied to, or used in accordance with, other systems, methods, apparatuses, and/or aspects described in this disclosure.

BRIEF DESCRIPTION OF THE DRAWINGS

The above and other objects and advantages of the disclosure will be apparent upon consideration of the following detailed description, taken in conjunction with the accompanying drawings, in which like reference characters refer to like parts throughout, and in which:

FIG. 6 is a flowchart of a detailed illustrative process for setting the volume level of the audio of a voice communications link in accordance with some embodiments in the disclosure;

DETAILED DESCRIPTION

Systems and methods for establishing a voice link between users accessing media using a media guidance application are provided. For example, the media guidance application may be implemented on user equipment (e.g., a set-top box, a television, etc.) and a voice communications device (e.g., a Google Home device, an Amazon Echo device, etc.). As referred to herein, "voice communications device" means a device that enables two or more users to talk with each other, such as a cell phone, conference bridge system, mobile phone, IP phone, computer tablet, personal computer, or an embedded or stand-alone intelligent voice response system (e.g., a Google Home device). For example, if a user is watching a basketball game on their television and is connected to their Google Home device, the media guidance application may search through the user's contacts list to identify a second user that is watching the same basketball game on a separate television and is connected to a separate Google Home device. The media guidance application may establish a voice communications link between the two Google Home devices that enables the users to speak to each other while watching the basketball game. As referred to herein, "voice communications link" means a connection between users that enables real-time voice communications to be exchanged, such as a Voice over Internet Protocol link, any cellular telephone link, a session with a videotelephony service or application (e.g., FaceTime, Skype, Amazon Echo's Drop In feature, etc.), multi-way radio communications, etc. Based on the content of the basketball game, the media guidance application may set and adjust the volume level of audio received by each user via the voice communications link. For example, for key plays in the game, the media guidance application may lower the volume of the audio of the voice communications link while maintaining the television volume to keep the voice communications link from distracting the user from the game. Conversely, during commercials or time-outs, the media guidance application may raise the volume of the audio of the voice communications link while maintaining the television volume. This automatic setting of the volume of the voice communications link enables users to avoid noisy distractions from the game and have a smoother and more enjoyable viewing experience.

Figure 1:
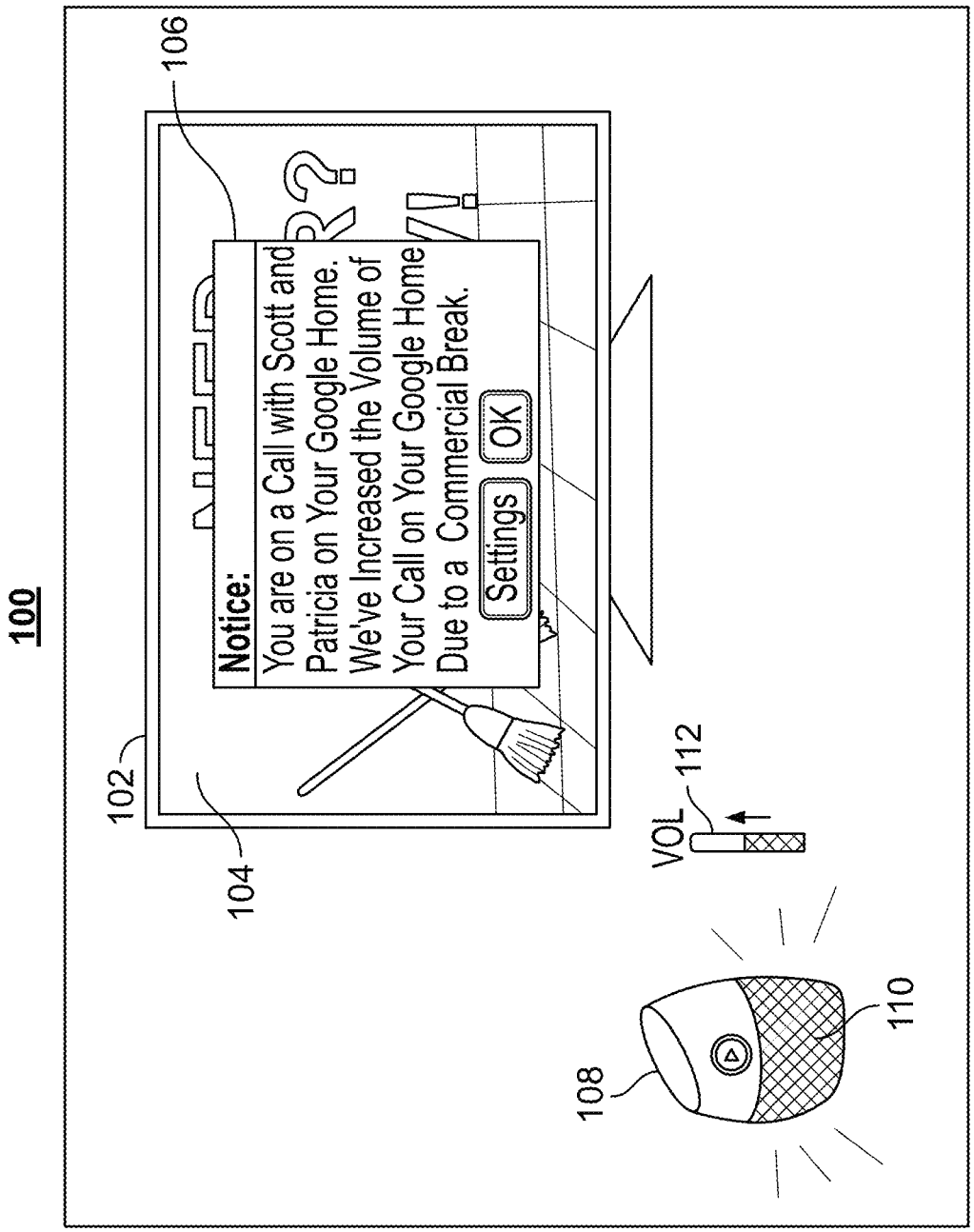
FIG. 1 shows a user device that accesses and displays media content and a user voice communications device that enables a voice communications link between multiple users in accordance with some embodiments of the disclosure.

FIG. 1 shows a user device 102 that accesses and displays media content 104 and a user voice communications device 108 that enables a voice communications link between multiple users according to some embodiments of the disclosure. For example, a user may be viewing television programming 104 on a set-top box 102 in the same location as a Google Home device 108. The user may be connected to a voice communications link via the Google Home device 108. The media guidance application may detect that the television programming content is commercial content and determine that the volume of the voice communications link should be increased with the reasoning that the user may be less engaged with commercial content than non-commercial content. The media guidance application may adjust the volume 112 of the speakers 110 of the Google Home device 108 based on the content 104 being accessed on the set-top box 102. The media guidance application may present a notification 106 on the display of the set-top box 102 on which the media content 104 is being accessed. The media guidance application may describe in the notification the status of the application, such as ongoing voice communications links, what media content is being accessed, etc. The media guidance application may describe in the notification actions by the application, such as increasing or decreasing the volume of the voice communications link, increasing or decreasing the volume of the device accessing the media content, etc.

In some embodiments, a media asset may be accessed using a first user device 102, the first user device being associated with a first user at a first location, the first location including a first voice communications device 108 associated with the first user. As referred to herein, "location" means the physical whereabouts of a user, such as the postal address of a house, a specific room within a house, a vehicle (e.g., a bus, a car, etc.), the address of a business (e.g., a restaurant), a public space (e.g., a park), a school campus, etc. As an example of these embodiments, a television show may be played on a user's television in the user's living room, where the user's Google Home device is located. In another example, a podcast may be streamed on a user's tablet computer in the user's bedroom, where the user's mobile phone is located.

In some embodiments, the first voice communications device 108 includes an audio output device 110 and the media guidance application may search, with the first user device 102, a local area network to identify the first voice communications device 108. The first voice communications device 108 may be connected to the first user device 102 or any peripheral devices of the first user device (e.g., a remote control device for a set-top box, a sound system for a television, etc.). For example, the media guidance application may issue a discovery command over a local area network. Any device that receives the discovery command may respond with its address and various other parameters (e.g., device ID, functions, manufacturer, physical location, etc.). The media guidance application may use the parameters in the device responses to identify the first voice communications device. For example, after issuing a discovery command, the media guidance application may detect an Amazon Echo device and a Google Home device, wherein both devices responded to the discovery command with a data structure that includes device location information. The media guidance application may use this location information to determine which device is closer to the first user device. The media guidance application may compare signal attenuation from the discovered devices to determine which device is closer to the first user device. The media guidance application may, upon determining that the Google Home device is closer to the first user device, select the Google Home device as the first user communications device.

After identifying the first voice communications device 108, the media guidance application may send a command to the device that specifies the device's volume level and causes the audio output device 110 of the first voice communications device 108 to change its volume setting 112 to match the specified volume level. The media guidance application may determine the specified device volume level by looking up the user's preferred volume level in a database or user profile. The media guidance application may set the volume based on the media content that the user is currently accessing and its attributes. The media guidance application may determine the specified device volume level by retrieving the volume level that the device was set to when it was last connected to by the media guidance application from a database that stores information on past device sessions. For example, after identifying the first user's Google Home device as the first voice communications device, the media guidance application may determine by querying a database that the Google Home device's volume was set to volume "5" when it was last connected to the media guidance application. The media guidance application may send a command to the Google Home specifying that its volume level be set to volume "5", causing the Google Home to set its speaker volume to "5".

The media guidance application may retrieve a contacts list associated with the first user and that includes contact information for each of a plurality of users, wherein the contacts list identifies a plurality of media assets currently being accessed by user devices associated with each of the plurality of users, respectively. For example, the media guidance application may iterate through a copy of the user's contacts list stored in storage 308 and which identifies other users' contact information and associated devices. Other users' contact information may include phone numbers, social media account usernames, device IP addresses, etc. For each entry of the list, the media guidance application may communicate over a remote server with the user devices associated with the entry to determine which media assets are being accessed by those devices. The media guidance application may update each entry of the list with an association to any media asset currently being accessed by the user devices associated with the entry.

The media guidance application may search the contacts list to identify which of the plurality of media assets corresponds to the media asset that is being accessed using the first user device. For example, the media guidance application may, after updating each contact in the user's contacts list with an association to any media assets currently being accessed by the contact, search through the list to identify which contacts are currently accessing the same media asset as the one currently accessed by the user.

The media guidance application may identify, based on searching the contacts list, a second user device associated with a second user that is currently accessing the media asset and is at a second location, the second location including a second voice communications device associated with the second user. For example, given a first user that is viewing a television program in their living room and connected to a Google Home device in that same room, the media guidance application may access a social network associated with the first user to find the first user's contacts. For each contact, the media guidance application may check a database to determine whether the contact has at least one voice communications device. For each contact that has at least one voice communications device, the media guidance application may identify what media content is being accessed by the contact by querying the contact's user equipment or service provider, sending a message to the contact asking them, and/or looking at their social feed to see interactions such as comments on a particular media asset. For example, the media guidance application may identify a second user accessing the same television program as the first user on the second user's tablet computer device in their bedroom, where the second user's Amazon Echo is also located.

The media guidance application may retrieve contact information associated with the second user from the contacts list and establish, based on the retrieved contact information, a voice communications link between the first and second voice communications devices that enables the first and second users to speak to each other while accessing the media asset. For example, after identifying that a second user is watching the same television program in the second user's house as the first user is watching in the first user's house, the media guidance application may retrieve the second user's Google Home device's IP address from the first user's contacts list and direct a communications request to that IP address.

In some embodiments, the first and second voice communications devices may each include a voice response system that receives verbal commands and responds to the verbal commands by performing an action and/or responding audibly. For example, a user may issue a question, such as "What show is on ABC tonight at 9?", to their voice communications device (e.g., the Google Home device), which may respond audibly by saying the appropriate television show name. In another example, a user may issue a voice command, such as "Turn on my television," to their voice communications device (e.g., the Google Home device), which may turn on the user's television and respond audibly confirming that it has executed the user's command.

In some embodiments, the media guidance application may receive, with the first voice communications device, a voice command from the first user requesting to communicate with a second user. The media guidance application may transmit a request to the second voice communications device of the second user to authorize the first user to communicate with the second user. For example, the first user's Google Home device may receive a voice command that requests to communicate with a second user, such as "Call Scott." This voice command may be detected by the first user's Google Home device's microphone and interpreted using speech recognition algorithms to determine that the device should send a communication request to the indicated second user. The media guidance application may transmit a request to the second user's voice communications device which, when received, causes the second user's voice communications device to prompt the user to authorize the communication. For example, the second user's voice communications device may prompt the second user with the question, "Incoming call from Patricia. Should I accept?" to which the second user can answer "Yes" or "No."

In response to receiving, with the second voice communications device, a voice command from the second user authorizing the first user to communicate with the second user, the media guidance application may form a real-time connection between the first voice communications device and the second voice communications device, wherein using the real-time connection the first voice communications device continuously transmits to the second voice communications device audio detected by a microphone of the first voice communications device, and wherein using the real-time connection, the second voice communications device continuously transmits to the first voice communications device audio detected by a microphone of the second voice communications device. The media guidance application may establish the real-time connection between different users with different types of voice response systems. For example, if the second user Scott says "Yes" to an incoming call request from first user Patricia, his Amazon Echo device and Patricia's Google Home device may establish a real-time connection between Scott and Patricia that involves both voice communications devices continuously detecting audio from each user with the microphones of their respective devices and transmitting the audio to the other device over a network that connects the devices.

In some embodiments, the media guidance application may retrieve contact information associated with a first user and establish a connection using this contact information when a specified command is received from the first user. For example, if a first user issues the verbal command, "Call Tom if he's watching the Superbowl," the media guidance application may search the first user's contacts list for the specified contact Tom and determine whether the contact is accessing the media asset indicated by the first user. After determining this, the media guidance application may establish a voice connection between the first user and the specified user Tom.

In some embodiments, the media guidance application may attempt to establish a connection with all users on the contacts list accessing the same media content as the first user. The media guidance application may do this automatically or in response to a verbal prompt from the user. For example, the media guidance application may, after identifying from the first user's contacts list other users that are accessing the same media content as the first user, automatically transmit voice communications requests to these other users to establish a voice communications link.

The media guidance application may direct the audio received via a voice communications link to the audio output device at the first location. For example, if a first user is connected to a voice communications link via their Google Home device 108, the media guidance application may direct the audio received by the first user's Google Home device 108 via the voice communications link to the Google Home's speakers 110.

In some embodiments, the media guidance application may adjust the volume of the audio received via the voice communications link and outputted at the audio output device based on speaker volume. For example, given three users that are connected via a voice communications link, the media guidance application may detect that the audio received by the first user's voice communications device is at a lower volume level than some threshold. This may be due to the first user being a soft speaker, the first user being far away from the microphone of the voice communications device, or another reason. The media guidance application may determine, if the volume of the audio received by the first user's voice communications device is less than a threshold volume level, that the volume of the audio outputted at the audio output devices of the second and third users' voice communications devices should be increased. Similarly, the media guidance application may detect that the audio received by the second user's voice communications device is at a higher volume level than some threshold. This may be due to the second user being a loud speaker, the second user being close in proximity to the microphone of the voice communications device, or another reason. The media guidance application may determine, if the volume of the audio received by the second user's voice communications device is greater than a threshold volume level, that the volume of the audio outputted at the audio output device of the first and third users' voice communications devices should be decreased.

In some embodiments, accessing the media asset using the first user device causes the audio of the media asset to be presented at a given volume level. The media guidance application may change the volume level of the audio received via the voice communications link from the second voice communications device and maintain the volume of the audio of the media asset at the given volume level while the volume level of audio received via the voice communications link is changed. For example, a television show may be accessed on a set-top box with a volume set to volume level "5". The media guidance application may change the volume level of the audio received via the voice communications link from volume level "5" to "7" while maintaining the set-top box volume at volume level "5" if it determines that the voice communications link volume should be increased for some reason. The media guidance application may notify the user that it has made a change to the volume of the user's voice communications device. For example, this notification may be shown in a visual prompt 106 on the display of the user device 102. This notification may also be announced verbally to the user through the audio output device 110 of the voice communications device 108 or another audio output device.

In some embodiments, the media guidance application may process metadata associated with the media asset to determine a first content attribute of a plurality of content attributes that is associated with content of the media asset currently being displayed to the first user. For example, the metadata associated with the media asset could include the audio of the media asset, a transcription or subtitles of the media asset, information provided in a content guide on the media asset, etc. The media guidance application may process metadata associated with the media asset before a voice communications link is established, after a voice communications link is established, and/or in the process of establishing a voice communications link, e.g., when a communications request is received by one user device from another. For example, the application may use natural language processing and predictive machine learning algorithms to identify keywords in the closed captions of a television show and to select the most relevant content-identifying keyword as the first content attribute.

In some embodiments, while the media guidance application is processing metadata, it may detect keywords in speech being exchanged by the first and second users over the voice communications link and compare the keywords to the words associated with the plurality of content attributes to identify a word associated with the first content attribute. This may be done to verify the media guidance application's identification of the content attributes. This may also be done to gauge level of user engagement with the content. The media guidance application may increase the volume of the voice communications link if a value indicating the level of engagement and/or relevance of the user conversation to the content material is determined to be above a certain threshold, or decrease the volume of the voice communications link if this value is determined to be below the threshold. For example, if the first content attribute indicates that the content is a sporting event, the media guidance application may identify keywords in the conversation between the first and second user such as "touchdown" and "yard" and compare these keywords to the content attributes. This may verify that the content is a football game. This may also allow the media guidance application to determine that the users' conversation is engaged with and relevant to the game, and accordingly increase the volume of the voice communications link.

The media guidance application may set, based on the first content attribute associated with the content currently being displayed to the first user, a volume level of audio received by the first voice communications device via the voice communications link, causing the audio received by the first voice communications device via the voice communications link from the second voice communications device to be presented to the first user at the set volume level. For example, if the first content attribute indicates that the content 104 currently being displayed to the first user is part of a commercial break during a television program, the media guidance application may increase the volume level of the call between the two users on the speakers 110 of the first user's Google Home device 108. The media guidance application may generate a visual notification 106 on the display of first user device 102 that notifies the user of any volume change.

In some embodiments, the media guidance application may search a database of volume levels associated with content attributes to identify a first volume level associated with the first content attribute. In such cases, setting the volume level causes the volume level to be adjusted to the identified first volume level. For example, if a user is connected to a call on their Google Home device and viewing a television program, with the first content attribute of the program indicating that the content is within the action genre, the application may query a database that indicates that the volume level of the television should be in the upper middle range (e.g., "13" on a volume scale of 1-20) and the volume level of the Google Home device should be relatively high (e.g., "8" on a volume scale of 1-10), with the reasoning that action content is generally viewed at moderate to loud volumes and the volume of a voice communications link must accordingly be loud for a user to hear it over the action content. The volume levels associated with content attributes may be set to default values by the media guidance application, adjusted manually by the user via an application user interface, adjusted by the media guidance application from analysis of user volume settings, etc. For example, the media guidance application may have a default maximum volume for football games of "5" and a default maximum volume for comedy of "8" that can be adjusted manually by the user or by the media guidance application from analysis of user viewing behavior.

In some embodiments, after processing metadata associated with the media asset to determine a first content attribute associated with the content currently being displayed to the user, the media guidance application may compare the first content attribute to a profile of the first user to determine an interest level associated with the currently displayed content. The user profile may be provided by the user or updated by the media guidance application through analysis of the user's viewing patterns and behaviors. For example, if the first content attribute indicates that the content falls under the genre of comedy, the media guidance application may look up a user profile stored in storage 308 that ranks the user's genre preferences. The media guidance application may use the user's genre preferences and machine learning algorithms to generate a numeric interest level that indicates the level of preference the user has for comedic content.

In response to determining that the interest level is above a threshold, the media guidance application may decrease the volume level of the audio received via the voice communications link. In response to determining that the interest level is below the threshold, the media guidance application may increase the volume level of the audio received via the voice communications link. For example, the threshold may be set by default to a numeric value within a range and adjusted manually by the user via an application user interface. The threshold may be stored in a database that can be queried by the media guidance application. If the user is watching a television show and their interest level is determined to be below the default or user-determined threshold value, the media guidance application may increase the volume of the voice communications link on the user's Google Home device. Conversely, if the user's interest level in the television show is determined to be above the default or user-determined threshold value, the media guidance application may decrease the volume of the voice communications link on the user's Google Home device.

In some embodiments, the media asset may be a sporting event. In such cases, the first content attribute represents a scoring metric indicating the likelihood of an upcoming scoring event in the sporting event. As referred to herein, "scoring metric" means a numeric value within a set range that indicates the likelihood of an upcoming scoring event in a sporting event. The media guidance application may, in response to determining that the scoring metric is above a threshold, decrease the volume level of the audio received via the voice communications link. In response to determining that the scoring metric is below the threshold, the media guidance application may increase the volume level of the audio received via the voice communications link. For example, if the user is viewing a football game, a scoring metric that indicates the likelihood of an upcoming touchdown within the next few minutes may be determined using speech recognition and machine learning algorithms that analyze the commentary of the sports announcers. The scoring metric threshold may be set by default to a numeric value within a range and adjusted manually by the user via an application user interface. The scoring metric threshold may be stored in a database that can be queried by the media guidance application. If the scoring metric is above the scoring metric threshold set by the system or the user, the media guidance application may decrease the volume of the voice communications link on the user's Google Home device to decrease the level of potential distraction from the football game that the voice link presents. If the metric is below the scoring metric threshold, the media guidance application may increase the volume of the voice communications link on the user's Google Home device.

In some embodiments, the first content attribute indicates at least one of a spoiler segment of the media asset and a non-commercial segment. In such cases, the media guidance application may decrease the volume level of the audio received via the voice communications link during at least one of the spoiler segment of the media asset and the non-commercial segment. For example, if a user is watching a television show, the identified first content attribute may be searched for in a database of content attributes that indicate spoiler content. If the first content attribute matches an entry in this database, indicating that the television program is currently playing a preview of the next episode of the show or similar spoiler material, the media guidance application may decrease the volume of the audio from the voice communications link on the user's voice communications device to minimize distraction from the spoiler content. The media guidance application may also increase the volume of the audio from the voice communications link in scenarios where the user has indicated this preference, for example by indicating in a user profile that they are uninterested in spoiler content. A first user's media guidance application may increase or maintain the volume of the voice communications link on the first user device while a second user's media guidance application simultaneously decreases or maintains the volume of the voice communications link on the second user device. In another example, if a user is watching a television show, the identified first content attribute may be searched for in a database of content attributes that indicate non-commercial content. If the first content attribute matches an entry in this database, indicating that the television program is currently playing non-commercial content, the media guidance application may decrease the volume of the audio from the voice communications link on the user's voice communications device if the user is more interested in non-commercial content than commercial content. The media guidance application may increase the volume of the audio from the voice communications link if the user is more interested in commercial content than non-commercial content.

The amount of content available to users in any given content delivery system can be substantial. Consequently, many users desire a form of media guidance through an interface that allows users to efficiently navigate content selections and easily identify content that they may desire. An application that provides such guidance is referred to herein as an interactive media guidance application or, sometimes, a media guidance application or a guidance application.

Interactive media guidance applications may take various forms depending on the content for which they provide guidance. One typical type of media guidance application is an interactive television program guide. Interactive television program guides (sometimes referred to as electronic program guides) are well-known guidance applications that, among other things, allow users to navigate among and locate many types of content or media assets. Interactive media guidance applications may generate graphical user interface screens that enable a user to navigate among, locate and select content. As referred to herein, the terms "media asset" and "content" should be understood to mean an electronically consumable user asset, such as television programming, as well as pay-per-view programs, on-demand programs (as in video-on-demand (VOD) systems), Internet content (e.g., streaming content, downloadable content, Webcasts, etc.), video clips, audio, content information, pictures, rotating images, documents, playlists, websites, articles, books, electronic books, blogs, chat sessions, social media, applications, games, and/or any other media or multimedia and/or combination of the same. Guidance applications also allow users to navigate among and locate content. As referred to herein, the term "multimedia" should be understood to mean content that utilizes at least two different content forms described above, for example, text, audio, images, video, or interactivity content forms. Content may be recorded, played, displayed or accessed by user equipment devices, but can also be part of a live performance.

The media guidance application and/or any instructions for performing any of the embodiments discussed herein may be encoded on computer readable media. Computer readable media includes any media capable of storing data. The computer readable media may be transitory, including, but not limited to, propagating electrical or electromagnetic signals, or may be non-transitory including, but not limited to, volatile and non-volatile computer memory or storage devices such as a hard disk, floppy disk, USB drive, DVD, CD, media cards, register memory, processor caches, Random Access Memory ("RAM"), etc.

With the advent of the Internet, mobile computing, and high-speed wireless networks, users are accessing media on user equipment devices on which they traditionally did not. As referred to herein, the phrase "user equipment device," "user equipment," "user device," "electronic device," "electronic equipment," "media equipment device," or "media device" should be understood to mean any device for accessing the content described above, such as a television, a Smart TV, a set-top box, an integrated receiver decoder (IRD) for handling satellite television, a digital storage device, a digital media receiver (DMR), a digital media adapter (DMA), a streaming media device, a DVD player, a DVD recorder, a connected DVD, a local media server, a BLU-RAY player, a BLU-RAY recorder, a personal computer (PC), a laptop computer, a tablet computer, a WebTV box, a personal computer television (PC/TV), a PC media server, a PC media center, a hand-held computer, a stationary telephone, a personal digital assistant (PDA), a mobile telephone, a portable video player, a portable music player, a portable gaming machine, a smart phone, or any other television equipment, computing equipment, or wireless device, and/or combination of the same. In some embodiments, the user equipment device may have a front facing screen and a rear facing screen, multiple front screens, or multiple angled screens. In some embodiments, the user equipment device may have a front facing camera and/or a rear facing camera. On these user equipment devices, users may be able to navigate among and locate the same content available through a television. Consequently, media guidance may be available on these devices, as well. The guidance provided may be for content available only through a television, for content available only through one or more of other types of user equipment devices, or for content available both through a television and one or more of the other types of user equipment devices. The media guidance applications may be provided as on-line applications (i.e., provided on a web-site), or as stand-alone applications or clients on user equipment devices. Various devices and platforms that may implement media guidance applications are described in more detail below.

One of the functions of the media guidance application is to provide media guidance data to users. As referred to herein, the phrase "media guidance data" or "guidance data" should be understood to mean any data related to content or data used in operating the guidance application. For example, the guidance data may include program information, guidance application settings, user preferences, user profile information, media listings, media-related information (e.g., broadcast times, broadcast channels, titles, descriptions, ratings information (e.g., parental control ratings, critic's ratings, etc.), genre or category information, actor information, logo data for broadcasters' or providers' logos, etc.), media format (e.g., standard definition, high definition, 3D, etc.), on-demand information, blogs, websites, and any other type of guidance data that is helpful for a user to navigate among and locate desired content selections.

Figure 2:
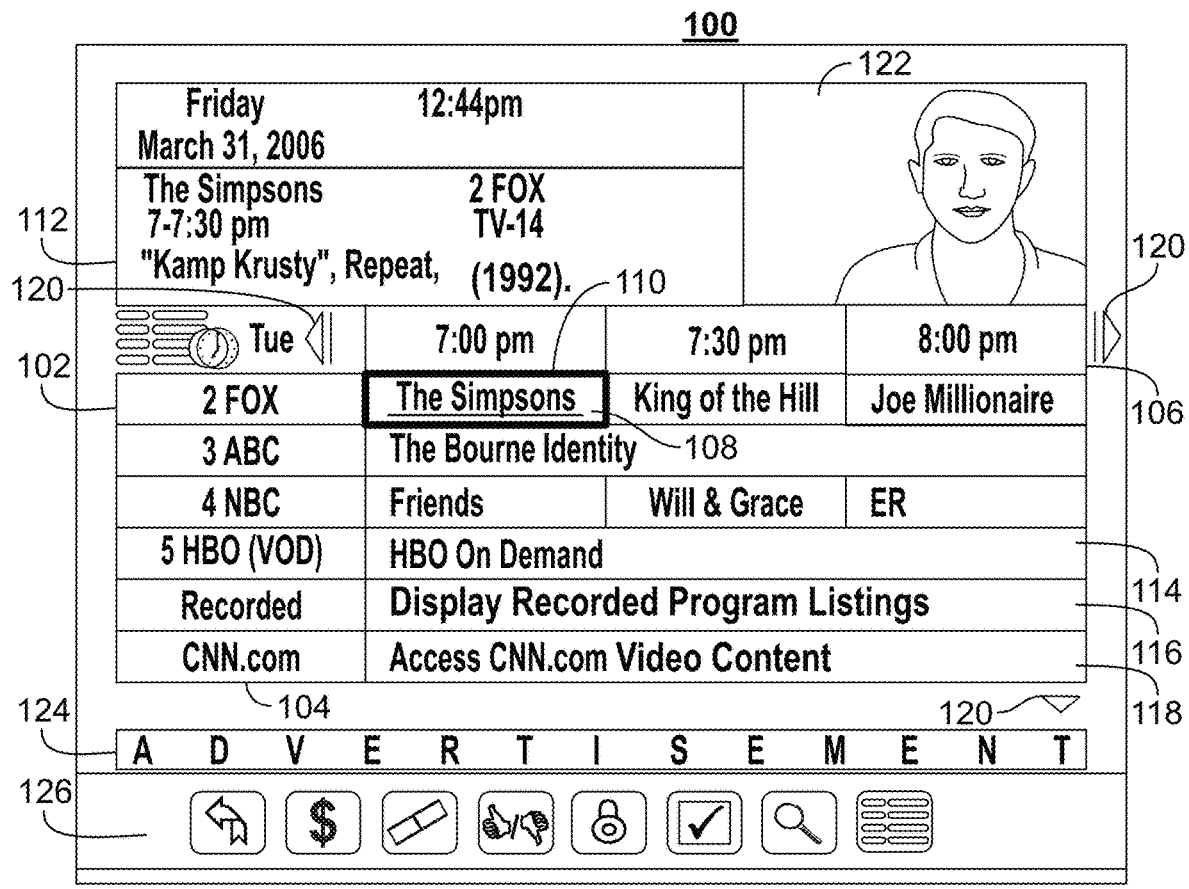
FIGS. 2 and 3 show illustrative examples of display screens generated by a media guidance application in accordance with some embodiments of the disclosure.
Figure 3:
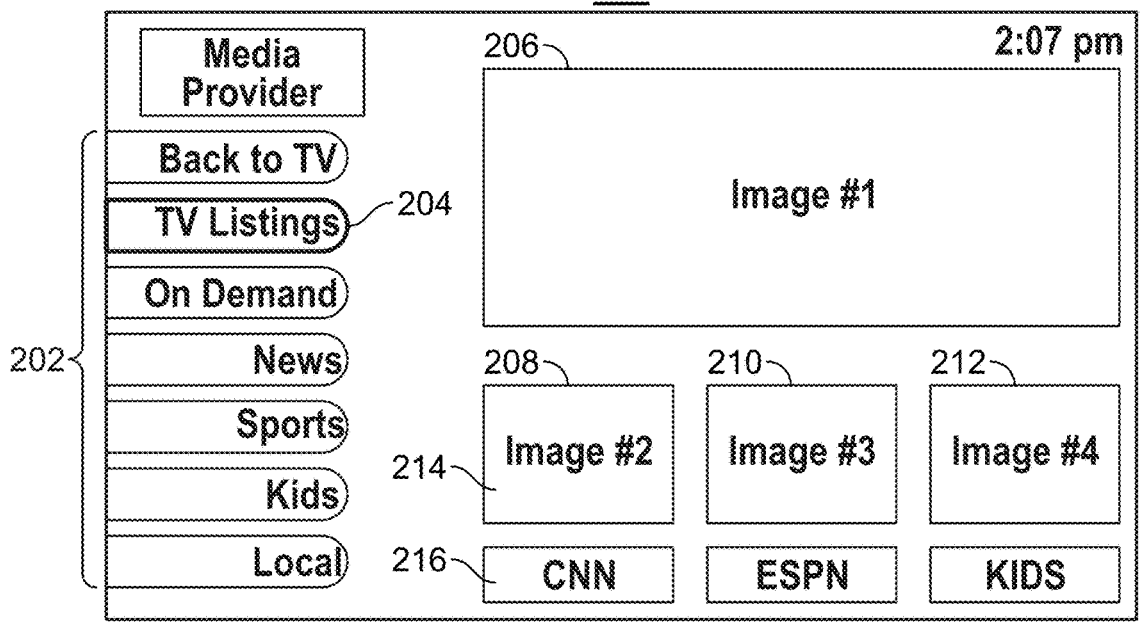

FIGS. 2-3 show illustrative display screens that may be used to provide media guidance data. The display screens shown in FIGS. 2-3 may be implemented on any suitable user equipment device or platform. While the displays of FIGS. 2-3 are illustrated as full screen displays, they may also be fully or partially overlaid over content being displayed. A user may indicate a desire to access content information by selecting a selectable option provided in a display screen (e.g., a menu option, a listings option, an icon, a hyperlink, etc.) or pressing a dedicated button (e.g., a GUIDE button) on a remote control or other user input interface or device. In response to the user's indication, the media guidance application may provide a display screen with media guidance data organized in one of several ways, such as by time and channel in a grid, by time, by channel, by source, by content type, by category (e.g., movies, sports, news, children, or other categories of programming), or other predefined, user-defined, or other organization criteria.

FIG. 2 shows illustrative grid of a program listings display 200 arranged by time and channel that also enables access to different types of content in a single display. Display 200 may include grid 202 with: (1) a column of channel/content type identifiers 204, where each channel/content type identifier (which is a cell in the column) identifies a different channel or content type available; and (2) a row of time identifiers 206, where each time identifier (which is a cell in the row) identifies a time block of programming. Grid 202 also includes cells of program listings, such as program listing 208, where each listing provides the title of the program provided on the listing's associated channel and time. With a user input device, a user can select program listings by moving highlight region 210. Information relating to the program listing selected by highlight region 210 may be provided in program information region 212. Region 212 may include, for example, the program title, the program description, the time the program is provided (if applicable), the channel the program is on (if applicable), the program's rating, and other desired information.

In addition to providing access to linear programming (e.g., content that is scheduled to be transmitted to a plurality of user equipment devices at a predetermined time and is provided according to a schedule), the media guidance application also provides access to non-linear programming (e.g., content accessible to a user equipment device at any time and is not provided according to a schedule). Non-linear programming may include content from different content sources including on-demand content (e.g., VOD), Internet content (e.g., streaming media, downloadable media, etc.), locally stored content (e.g., content stored on any user equipment device described above or other storage device), or other time-independent content. On-demand content may include movies or any other content provided by a particular content provider (e.g., HBO On Demand providing "The Sopranos" and "Curb Your Enthusiasm"). HBO ON DEMAND is a service mark owned by Time Warner Company L.P. et al. and THE SOPRANOS and CURB YOUR ENTHUSIASM are trademarks owned by the Home Box Office, Inc. Internet content may include web events, such as a chat session or Webcast, or content available on-demand as streaming content or downloadable content through an Internet web site or other Internet access (e.g. FTP).

Grid 202 may provide media guidance data for non-linear programming including on-demand listing 214, recorded content listing 216, and Internet content listing 218. A display combining media guidance data for content from different types of content sources is sometimes referred to as a "mixed-media" display. Various permutations of the types of media guidance data that may be displayed that are different than display 200 may be based on user selection or guidance application definition (e.g., a display of only recorded and broadcast listings, only on-demand and broadcast listings, etc.). As illustrated, listings 214, 216, and 218 are shown as spanning the entire time block displayed in grid 202 to indicate that selection of these listings may provide access to a display dedicated to on-demand listings, recorded listings, or Internet listings, respectively. In some embodiments, listings for these content types may be included directly in grid 202. Additional media guidance data may be displayed in response to the user selecting one of the navigational icons 220. (Pressing an arrow key on a user input device may affect the display in a similar manner as selecting navigational icons 220.)

Display 200 may also include video region 222, and options region 226. Video region 222 may allow the user to view and/or preview programs that are currently available, will be available, or were available to the user. The content of video region 222 may correspond to, or be independent from, one of the listings displayed in grid 202. Grid displays including a video region are sometimes referred to as picture-in-guide (PIG) displays. PIG displays and their functionalities are described in greater detail in Satterfield et al. U.S. Pat. No. 6,564,378, issued May 13, 2003 and Yuen et al. U.S. Pat. No. 6,239,794, issued May 29, 2001, which are hereby incorporated by reference herein in their entireties. PIG displays may be included in other media guidance application display screens of the embodiments described herein.

Options region 226 may allow the user to access different types of content, media guidance application displays, and/or media guidance application features. Options region 226 may be part of display 200 (and other display screens described herein), or may be invoked by a user by selecting an on-screen option or pressing a dedicated or assignable button on a user input device. The selectable options within options region 226 may concern features related to program listings in grid 202 or may include options available from a main menu display. Features related to program listings may include searching for other air times or ways of receiving a program, recording a program, enabling series recording of a program, setting program and/or channel as a favorite, purchasing a program, or other features. Options available from a main menu display may include search options, VOD options, parental control options, Internet options, cloud-based options, device synchronization options, second screen device options, options to access various types of media guidance data displays, options to subscribe to a premium service, options to edit a user's profile, options to access a browse overlay, or other options.

The media guidance application may be personalized based on a user's preferences. A personalized media guidance application allows a user to customize displays and features to create a personalized "experience" with the media guidance application. This personalized experience may be created by allowing a user to input these customizations and/or by the media guidance application monitoring user activity to determine various user preferences. Users may access their personalized guidance application by logging in or otherwise identifying themselves to the guidance application. Customization of the media guidance application may be made in accordance with a user profile. The customizations may include varying presentation schemes (e.g., color scheme of displays, font size of text, etc.), aspects of content listings displayed (e.g., only HDTV or only 3D programming, user-specified broadcast channels based on favorite channel selections, re-ordering the display of channels, recommended content, etc.), desired recording features (e.g., recording or series recordings for particular users, recording quality, etc.), parental control settings, customized presentation of Internet content (e.g., presentation of social media content, e-mail, electronically delivered articles, etc.) and other desired customizations.

The media guidance application may allow a user to provide user profile information or may automatically compile user profile information. The media guidance application may, for example, monitor the content the user accesses and/or other interactions the user may have with the guidance application. Additionally, the media guidance application may obtain all or part of other user profiles that are related to a particular user (e.g., from other web sites on the Internet the user accesses, such as www.Tivo.com, from other media guidance applications the user accesses, from other interactive applications the user accesses, from another user equipment device of the user, etc.), and/or obtain information about the user from other sources that the media guidance application may access. As a result, a user can be provided with a unified guidance application experience across the user's different user equipment devices. This type of user experience is described in greater detail below in connection with FIG. 5. Additional personalized media guidance application features are described in greater detail in Ellis et al., U.S. Patent Application Publication No. 2005/0251827, filed Jul. 11, 2005, Boyer et al., U.S. Pat. No. 7,165,098, issued Jan. 16, 2007, and Ellis et al., U.S. Patent Application Publication No. 2002/0174430, filed Feb. 21, 2002, which are hereby incorporated by reference herein in their entireties.

Another display arrangement for providing media guidance is shown in FIG. 3. Video mosaic display 300 includes selectable options 302 for content information organized based on content type, genre, and/or other organization criteria. In display 300, television listings option 304 is selected, thus providing listings 306, 308, 310, and 312 as broadcast program listings. In display 300 the listings may provide graphical images including cover art, still images from the content, video clip previews, live video from the content, or other types of content that indicate to a user the content being described by the media guidance data in the listing. Each of the graphical listings may also be accompanied by text to provide further information about the content associated with the listing. For example, listing 308 may include more than one portion, including media portion 314 and text portion 316. Media portion 314 and/or text portion 316 may be selectable to view content in full-screen or to view information related to the content displayed in media portion 314 (e.g., to view listings for the channel that the video is displayed on).

The listings in display 300 are of different sizes (i.e., listing 306 is larger than listings 308, 310, and 312), but if desired, all the listings may be the same size. Listings may be of different sizes or graphically accentuated to indicate degrees of interest to the user or to emphasize certain content, as desired by the content provider or based on user preferences. Various systems and methods for graphically accentuating content listings are discussed in, for example, Yates, U.S. Patent Application Publication No. 2010/0153885, filed Nov. 12, 2009, which is hereby incorporated by reference herein in its entirety.

Figure 4:
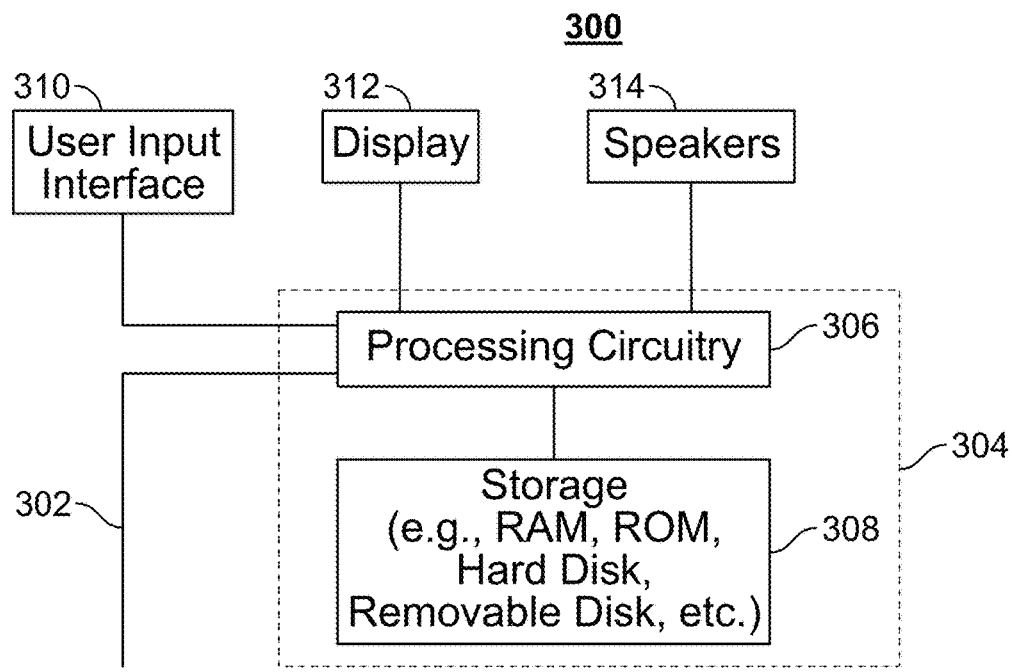
FIG. 4 is a block diagram of an illustrative user equipment device in accordance with some embodiments in the disclosure.

Users may access content and the media guidance application (and its display screens described above and below) from one or more of their user equipment devices. FIG. 4 shows a generalized embodiment of illustrative user equipment device 400. More specific implementations of user equipment devices are discussed below in connection with FIG. 5. User equipment device 400 may receive content and data via input/output (hereinafter "I/O") path 402. I/O path 402 may provide content (e.g., broadcast programming, on-demand programming, Internet content, content available over a local area network (LAN) or wide area network (WAN), and/or other content) and data to control circuitry 404, which includes processing circuitry 406 and storage 408. Control circuitry 404 may be used to send and receive commands, requests, and other suitable data using I/O path 402. I/O path 402 may connect control circuitry 404 (and specifically processing circuitry 406) to one or more communications paths (described below). I/O functions may be provided by one or more of these communications paths, but are shown as a single path in FIG. 4 to avoid overcomplicating the drawing.

Control circuitry 404 may be based on any suitable processing circuitry such as processing circuitry 406. As referred to herein, processing circuitry should be understood to mean circuitry based on one or more microprocessors, microcontrollers, digital signal processors, programmable logic devices, field-programmable gate arrays (FPGAs), application-specific integrated circuits (ASICs), etc., and may include a multi-core processor (e.g., dual-core, quad-core, hexa-core, or any suitable number of cores) or supercomputer. In some embodiments, processing circuitry may be distributed across multiple separate processors or processing units, for example, multiple of the same type of processing units (e.g., two Intel Core i7 processors) or multiple different processors (e.g., an Intel Core i5 processor and an Intel Core i7 processor). In some embodiments, control circuitry 404 executes instructions for a media guidance application stored in memory (i.e., storage 408). Specifically, control circuitry 404 may be instructed by the media guidance application to perform the functions discussed above and below. For example, the media guidance application may provide instructions to control circuitry 404 to generate the media guidance displays. In some implementations, any action performed by control circuitry 404 may be based on instructions received from the media guidance application.

In client-server based embodiments, control circuitry 404 may include communications circuitry suitable for communicating with a guidance application server or other networks or servers. The instructions for carrying out the above mentioned functionality may be stored on the guidance application server. Communications circuitry may include a cable modem, an integrated services digital network (ISDN) modem, a digital subscriber line (DSL) modem, a telephone modem, Ethernet card, or a wireless modem for communications with other equipment, or any other suitable communications circuitry. Such communications may involve the Internet or any other suitable communications networks or paths (which is described in more detail in connection with FIG. 5). In addition, communications circuitry may include circuitry that enables peer-to-peer communication of user equipment devices, or communication of user equipment devices in locations remote from each other (described in more detail below).

Memory may be an electronic storage device provided as storage 408 that is part of control circuitry 404. As referred to herein, the phrase "electronic storage device" or "storage device" should be understood to mean any device for storing electronic data, computer software, or firmware, such as random-access memory, read-only memory, hard drives, optical drives, digital video disc (DVD) recorders, compact disc (CD) recorders, BLU-RAY disc (BD) recorders, BLU-RAY 3D disc recorders, digital video recorders (DVR, sometimes called a personal video recorder, or PVR), solid state devices, quantum storage devices, gaming consoles, gaming media, or any other suitable fixed or removable storage devices, and/or any combination of the same. Storage 408 may be used to store various types of content described herein as well as media guidance data described above. Nonvolatile memory may also be used (e.g., to launch a boot-up routine and other instructions). Cloud-based storage, described in relation to FIG. 5, may be used to supplement storage 408 or instead of storage 408.

Control circuitry 404 may include video generating circuitry and tuning circuitry, such as one or more analog tuners, one or more MPEG-2 decoders or other digital decoding circuitry, high-definition tuners, or any other suitable tuning or video circuits or combinations of such circuits. Encoding circuitry (e.g., for converting over-the-air, analog, or digital signals to MPEG signals for storage) may also be provided. Control circuitry 404 may also include scaler circuitry for upconverting and downconverting content into the preferred output format of the user equipment 400. Circuitry 404 may also include digital-to-analog converter circuitry and analog-to-digital converter circuitry for converting between digital and analog signals. The tuning and encoding circuitry may be used by the user equipment device to receive and to display, to play, or to record content. The tuning and encoding circuitry may also be used to receive guidance data. The circuitry described herein, including for example, the tuning, video generating, encoding, decoding, encrypting, decrypting, scaler, and analog/digital circuitry, may be implemented using software running on one or more general purpose or specialized processors. Multiple tuners may be provided to handle simultaneous tuning functions (e.g., watch and record functions, picture-in-picture (PIP) functions, multiple-tuner recording, etc.). If storage 408 is provided as a separate device from user equipment 400, the tuning and encoding circuitry (including multiple tuners) may be associated with storage 408.

A user may send instructions to control circuitry 404 using user input interface 410. User input interface 410 may be any suitable user interface, such as a remote control, mouse, trackball, keypad, keyboard, touch screen, touchpad, stylus input, joystick, voice recognition interface, or other user input interfaces. Display 412 may be provided as a stand-alone device or integrated with other elements of user equipment device 400. For example, display 412 may be a touchscreen or touch-sensitive display. In such circumstances, user input interface 410 may be integrated with or combined with display 412. Display 412 may be one or more of a monitor, a television, a liquid crystal display (LCD) for a mobile device, amorphous silicon display, low temperature poly silicon display, electronic ink display, electrophoretic display, active matrix display, electro-wetting display, electrofluidic display, cathode ray tube display, light-emitting diode display, electroluminescent display, plasma display panel, high-performance addressing display, thin-film transistor display, organic light-emitting diode display, surface-conduction electron-emitter display (SED), laser television, carbon nanotubes, quantum dot display, interferometric modulator display, or any other suitable equipment for displaying visual images. In some embodiments, display 412 may be HDTV-capable. In some embodiments, display 412 may be a 3D display, and the interactive media guidance application and any suitable content may be displayed in 3D. A video card or graphics card may generate the output to the display 412. The video card may offer various functions such as accelerated rendering of 3D scenes and 2D graphics, MPEG-2/MPEG-4 decoding, TV output, or the ability to connect multiple monitors. The video card may be any processing circuitry described above in relation to control circuitry 404. The video card may be integrated with the control circuitry 404. Speakers 414 may be provided as integrated with other elements of user equipment device 400 or may be stand-alone units. The audio component of videos and other content displayed on display 412 may be played through speakers 414. In some embodiments, the audio may be distributed to a receiver (not shown), which processes and outputs the audio via speakers 414.

The guidance application may be implemented using any suitable architecture. For example, it may be a stand-alone application wholly-implemented on user equipment device 400. In such an approach, instructions of the application are stored locally (e.g., in storage 408), and data for use by the application is downloaded on a periodic basis (e.g., from an out-of-band feed, from an Internet resource, or using another suitable approach). Control circuitry 404 may retrieve instructions of the application from storage 408 and process the instructions to generate any of the displays discussed herein. Based on the processed instructions, control circuitry 404 may determine what action to perform when input is received from input interface 410. For example, movement of a cursor on a display up/down may be indicated by the processed instructions when input interface 410 indicates that an up/down button was selected.

In some embodiments, the media guidance application is a client-server based application. Data for use by a thick or thin client implemented on user equipment device 400 is retrieved on-demand by issuing requests to a server remote to the user equipment device 400. In one example of a client-server based guidance application, control circuitry 404 runs a web browser that interprets web pages provided by a remote server. For example, the remote server may store the instructions for the application in a storage device. The remote server may process the stored instructions using circuitry (e.g., control circuitry 404) and generate the displays discussed above and below. The client device may receive the displays generated by the remote server and may display the content of the displays locally on equipment device 400. This way, the processing of the instructions is performed remotely by the server while the resulting displays are provided locally on equipment device 400. Equipment device 400 may receive inputs from the user via input interface 410 and transmit those inputs to the remote server for processing and generating the corresponding displays. For example, equipment device 400 may transmit a communication to the remote server indicating that an up/down button was selected via input interface 410. The remote server may process instructions in accordance with that input and generate a display of the application corresponding to the input (e.g., a display that moves a cursor up/down). The generated display is then transmitted to equipment device 400 for presentation to the user.

In some embodiments, the media guidance application is downloaded and interpreted or otherwise run by an interpreter or virtual machine (run by control circuitry 404). In some embodiments, the guidance application may be encoded in the ETV Binary Interchange Format (EBIF), received by control circuitry 404 as part of a suitable feed, and interpreted by a user agent running on control circuitry 404. For example, the guidance application may be an EBIF application. In some embodiments, the guidance application may be defined by a series of JAVA-based files that are received and run by a local virtual machine or other suitable middleware executed by control circuitry 404. In some of such embodiments (e.g., those employing MPEG-2 or other digital media encoding schemes), the guidance application may be, for example, encoded and transmitted in an MPEG-2 object carousel with the MPEG audio and video packets of a program.

Figure 5:
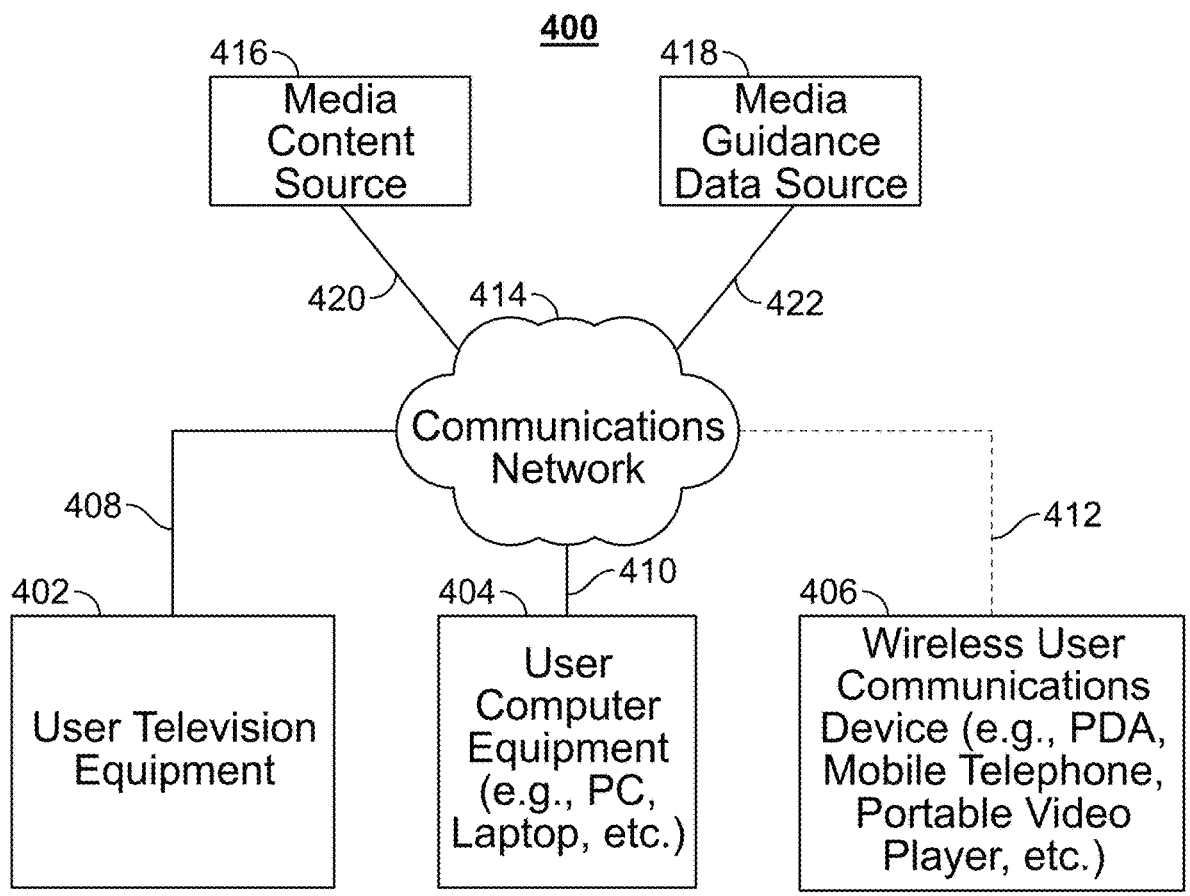
FIG. 5 is a block diagram of an illustrative media system in accordance with some embodiments of the disclosure.

User equipment device 400 of FIG. 4 can be implemented in system 500 of FIG. 5 as user television equipment 502, user computer equipment 504, wireless user communications device 506, or any other type of user equipment suitable for accessing content, such as a non-portable gaming machine. For simplicity, these devices may be referred to herein collectively as user equipment or user equipment devices, and may be substantially similar to user equipment devices described above. User equipment devices, on which a media guidance application may be implemented, may function as a standalone device or may be part of a network of devices. Various network configurations of devices may be implemented and are discussed in more detail below.

A user equipment device utilizing at least some of the system features described above in connection with FIG. 4 may not be classified solely as user television equipment 502, user computer equipment 504, or a wireless user communications device 506. For example, user television equipment 502 may, like some user computer equipment 504, be Internet-enabled allowing for access to Internet content, while user computer equipment 504 may, like some television equipment 502, include a tuner allowing for access to television programming. The media guidance application may have the same layout on various different types of user equipment or may be tailored to the display capabilities of the user equipment. For example, on user computer equipment 504, the guidance application may be provided as a web site accessed by a web browser. In another example, the guidance application may be scaled down for wireless user communications devices 506.

In system 500, there is typically more than one of each type of user equipment device but only one of each is shown in FIG. 5 to avoid overcomplicating the drawing. In addition, each user may utilize more than one type of user equipment device and also more than one of each type of user equipment device.

In some embodiments, a user equipment device (e.g., user television equipment 502, user computer equipment 504, wireless user communications device 506) may be referred to as a "second screen device." For example, a second screen device may supplement content presented on a first user equipment device. The content presented on the second screen device may be any suitable content that supplements the content presented on the first device. In some embodiments, the second screen device provides an interface for adjusting settings and display preferences of the first device. In some embodiments, the second screen device is configured for interacting with other second screen devices or for interacting with a social network. The second screen device can be located in the same room as the first device, a different room from the first device but in the same house or building, or in a different building from the first device.

The user may also set various settings to maintain consistent media guidance application settings across in-home devices and remote devices. Settings include those described herein, as well as channel and program favorites, programming preferences that the guidance application utilizes to make programming recommendations, display preferences, and other desirable guidance settings. For example, if a user sets a channel as a favorite on, for example, the web site www.Tivo.com on their personal computer at their office, the same channel would appear as a favorite on the user's in-home devices (e.g., user television equipment and user computer equipment) as well as the user's mobile devices, if desired. Therefore, changes made on one user equipment device can change the guidance experience on another user equipment device, regardless of whether they are the same or a different type of user equipment device. In addition, the changes made may be based on settings input by a user, as well as user activity monitored by the guidance application.

The user equipment devices may be coupled to communications network 514. Namely, user television equipment 502, user computer equipment 504, and wireless user communications device 506 are coupled to communications network 514 via communications paths 508, 510, and 512, respectively. Communications network 514 may be one or more networks including the Internet, a mobile phone network, mobile voice or data network (e.g., a 4G or LTE network), cable network, public switched telephone network, or other types of communications network or combinations of communications networks. Paths 508, 510, and 512 may separately or together include one or more communications paths, such as, a satellite path, a fiber-optic path, a cable path, a path that supports Internet communications (e.g., IPTV), free-space connections (e.g., for broadcast or other wireless signals), or any other suitable wired or wireless communications path or combination of such paths. Path 512 is drawn with dotted lines to indicate that in the exemplary embodiment shown in FIG. 5 it is a wireless path and paths 508 and 510 are drawn as solid lines to indicate they are wired paths (although these paths may be wireless paths, if desired). Communications with the user equipment devices may be provided by one or more of these communications paths, but are shown as a single path in FIG. 5 to avoid overcomplicating the drawing.

Although communications paths are not drawn between user equipment devices, these devices may communicate directly with each other via communication paths, such as those described above in connection with paths 508, 510, and 512, as well as other short-range point-to-point communication paths, such as USB cables, IEEE 1394 cables, wireless paths (e.g., Bluetooth, infrared, IEEE 802-11x, etc.), or other short-range communication via wired or wireless paths. BLUETOOTH is a certification mark owned by Bluetooth SIG, INC. The user equipment devices may also communicate with each other directly through an indirect path via communications network 514.

System 500 includes content source 516 and media guidance data source 518 coupled to communications network 514 via communication paths 520 and 522, respectively. Paths 520 and 522 may include any of the communication paths described above in connection with paths 508, 510, and 512. Communications with the content source 516 and media guidance data source 518 may be exchanged over one or more communications paths, but are shown as a single path in FIG. 5 to avoid overcomplicating the drawing. In addition, there may be more than one of each of content source 516 and media guidance data source 518, but only one of each is shown in FIG. 5 to avoid overcomplicating the drawing. (The different types of each of these sources are discussed below.) If desired, content source 516 and media guidance data source 518 may be integrated as one source device. Although communications between sources 516 and 518 with user equipment devices 502, 504, and 506 are shown as through communications network 514, in some embodiments, sources 516 and 518 may communicate directly with user equipment devices 502, 504, and 506 via communication paths (not shown) such as those described above in connection with paths 508, 510, and 512.

System 500 may also include an advertisement source 524 coupled to communications network 514 via a communications path 526. Path 526 may include any of the communication paths described above in connection with paths 508, 510, and 512. Advertisement source 524 may include advertisement logic to determine which advertisements to transmit to specific users and under which circumstances. For example, a cable operator may have the right to insert advertisements during specific time slots on specific channels. Thus, advertisement source 524 may transmit advertisements to users during those time slots. As another example, advertisement source may target advertisements based on the demographics of users known to view a particular show (e.g., teenagers viewing a reality show). As yet another example, advertisement source may provide different advertisements depending on the location of the user equipment viewing a media asset (e.g., east coast or west coast).

In some embodiments, advertisement source 524 may be configured to maintain user information including advertisement-suitability scores associated with user in order to provide targeted advertising. Additionally or alternatively, a server associated with advertisement source 524 may be configured to store raw information that may be used to derive advertisement-suitability scores. In some embodiments, advertisement source 524 may transmit a request to another device for the raw information and calculate the advertisement-suitability scores. Advertisement source 524 may update advertisement-suitability scores for specific users (e.g., first subset, second subset, or third subset of users) and transmit an advertisement of the target product to appropriate users.

Content source 516 may include one or more types of content distribution equipment including a television distribution facility, cable system headend, satellite distribution facility, programming sources (e.g., television broadcasters, such as NBC, ABC, HBO, etc.), intermediate distribution facilities and/or servers, Internet providers, on-demand media servers, and other content providers. NBC is a trademark owned by the National Broadcasting Company, Inc., ABC is a trademark owned by the American Broadcasting Company, Inc., and HBO is a trademark owned by the Home Box Office, Inc. Content source 516 may be the originator of content (e.g., a television broadcaster, a Webcast provider, etc.) or may not be the originator of content (e.g., an on-demand content provider, an Internet provider of content of broadcast programs for downloading, etc.). Content source 516 may include cable sources, satellite providers, on-demand providers, Internet providers, over-the-top content providers, or other providers of content. Content source 516 may also include a remote media server used to store different types of content (including video content selected by a user), in a location remote from any of the user equipment devices. Systems and methods for remote storage of content, and providing remotely stored content to user equipment are discussed in greater detail in connection with Ellis et al., U.S. Pat. No. 7,761,892, issued Jul. 20, 2010, which is hereby incorporated by reference herein in its entirety.

Media guidance data source 518 may provide media guidance data, such as the media guidance data described above. Media guidance data may be provided to the user equipment devices using any suitable approach. In some embodiments, the guidance application may be a standalone interactive television program guide that receives program guide data via a data feed (e.g., a continuous feed or trickle feed). Program schedule data and other guidance data may be provided to the user equipment on a television channel sideband, using an in-band digital signal, using an out-of-band digital signal, or by any other suitable data transmission technique. Program schedule data and other media guidance data may be provided to user equipment on multiple analog or digital television channels.

In some embodiments, guidance data from media guidance data source 518 may be provided to users' equipment using a client-server approach. For example, a user equipment device may pull media guidance data from a server, or a server may push media guidance data to a user equipment device. In some embodiments, a guidance application client residing on the user's equipment may initiate sessions with source 518 to obtain guidance data when needed, e.g., when the guidance data is out of date or when the user equipment device receives a request from the user to receive data. Media guidance may be provided to the user equipment with any suitable frequency (e.g., continuously, daily, a user-specified period of time, a system-specified period of time, in response to a request from user equipment, etc.). Media guidance data source 518 may provide user equipment devices 502, 504, and 506 the media guidance application itself or software updates for the media guidance application.

In some embodiments, the media guidance data may include viewer data. For example, the viewer data may include current and/or historical user activity information (e.g., what content the user typically watches, what times of day the user watches content, whether the user interacts with a social network, at what times the user interacts with a social network to post information, what types of content the user typically watches (e.g., pay TV or free TV), mood, brain activity information, etc.). The media guidance data may also include subscription data. For example, the subscription data may identify to which sources or services a given user subscribes and/or to which sources or services the given user has previously subscribed but later terminated access (e.g., whether the user subscribes to premium channels, whether the user has added a premium level of services, whether the user has increased Internet speed). In some embodiments, the viewer data and/or the subscription data may identify patterns of a given user for a period of more than one year. The media guidance data may include a model (e.g., a survivor model) used for generating a score that indicates a likelihood a given user will terminate access to a service/source. For example, the media guidance application may process the viewer data with the subscription data using the model to generate a value or score that indicates a likelihood of whether the given user will terminate access to a particular service or source. In particular, a higher score may indicate a higher level of confidence that the user will terminate access to a particular service or source. Based on the score, the media guidance application may generate promotions that entice the user to keep the particular service or source indicated by the score as one to which the user will likely terminate access.

Media guidance applications may be, for example, standalone applications implemented on user equipment devices. For example, the media guidance application may be implemented as software or a set of executable instructions which may be stored in storage 408, and executed by control circuitry 404 of a user equipment device 400. In some embodiments, media guidance applications may be client-server applications where only a client application resides on the user equipment device, and server application resides on a remote server. For example, media guidance applications may be implemented partially as a client application on control circuitry 404 of user equipment device 400 and partially on a remote server as a server application (e.g., media guidance data source 518) running on control circuitry of the remote server. When executed by control circuitry of the remote server (such as media guidance data source 518), the media guidance application may instruct the control circuitry to generate the guidance application displays and transmit the generated displays to the user equipment devices. The server application may instruct the control circuitry of the media guidance data source 518 to transmit data for storage on the user equipment. The client application may instruct control circuitry of the receiving user equipment to generate the guidance application displays.

Content and/or media guidance data delivered to user equipment devices 502, 504, and 506 may be over-the-top (OTT) content. OTT content delivery allows Internet-enabled user devices, including any user equipment device described above, to receive content that is transferred over the Internet, including any content described above, in addition to content received over cable or satellite connections. OTT content is delivered via an Internet connection provided by an Internet service provider (ISP), but a third party distributes the content. The ISP may not be responsible for the viewing abilities, copyrights, or redistribution of the content, and may only transfer IP packets provided by the OTT content provider. Examples of OTT content providers include YOUTUBE, NETFLIX, and HULU, which provide audio and video via IP packets. Youtube is a trademark owned by Google Inc., Netflix is a trademark owned by Netflix Inc., and Hulu is a trademark owned by Hulu, LLC. OTT content providers may additionally or alternatively provide media guidance data described above. In addition to content and/or media guidance data, providers of OTT content can distribute media guidance applications (e.g., web-based applications or cloud-based applications), or the content can be displayed by media guidance applications stored on the user equipment device.

Media guidance system 500 is intended to illustrate a number of approaches, or network configurations, by which user equipment devices and sources of content and guidance data may communicate with each other for the purpose of accessing content and providing media guidance. The embodiments described herein may be applied in any one or a subset of these approaches, or in a system employing other approaches for delivering content and providing media guidance. The following four approaches provide specific illustrations of the generalized example of FIG. 5.

In one approach, user equipment devices may communicate with each other within a home network. User equipment devices can communicate with each other directly via short-range point-to-point communication schemes described above, via indirect paths through a hub or other similar device provided on a home network, or via communications network 514. Each of the multiple individuals in a single home may operate different user equipment devices on the home network. As a result, it may be desirable for various media guidance information or settings to be communicated between the different user equipment devices. For example, it may be desirable for users to maintain consistent media guidance application settings on different user equipment devices within a home network, as described in greater detail in Ellis et al., U.S. Patent Publication No. 2005/0251827, filed Jul. 11, 2005. Different types of user equipment devices in a home network may also communicate with each other to transmit content. For example, a user may transmit content from user computer equipment to a portable video player or portable music player.

In a second approach, users may have multiple types of user equipment by which they access content and obtain media guidance. For example, some users may have home networks that are accessed by in-home and mobile devices. Users may control in-home devices via a media guidance application implemented on a remote device. For example, users may access an online media guidance application on a website via a personal computer at their office, or a mobile device such as a PDA or web-enabled mobile telephone. The user may set various settings (e.g., recordings, reminders, or other settings) on the online guidance application to control the user's in-home equipment. The online guide may control the user's equipment directly, or by communicating with a media guidance application on the user's in-home equipment. Various systems and methods for user equipment devices communicating, where the user equipment devices are in locations remote from each other, is discussed in, for example, Ellis et al., U.S. Pat. No. 8,046,801, issued Oct. 25, 2011, which is hereby incorporated by reference herein in its entirety.

In a third approach, users of user equipment devices inside and outside a home can use their media guidance application to communicate directly with content source 516 to access content. Specifically, within a home, users of user television equipment 502 and user computer equipment 504 may access the media guidance application to navigate among and locate desirable content. Users may also access the media guidance application outside of the home using wireless user communications devices 506 to navigate among and locate desirable content.

In a fourth approach, user equipment devices may operate in a cloud computing environment to access cloud services. In a cloud computing environment, various types of computing services for content sharing, storage or distribution (e.g., video sharing sites or social networking sites) are provided by a collection of network-accessible computing and storage resources, referred to as "the cloud." For example, the cloud can include a collection of server computing devices, which may be located centrally or at distributed locations, that provide cloud-based services to various types of users and devices connected via a network such as the Internet via communications network 514. These cloud resources may include one or more content sources 516 and one or more media guidance data sources 518. In addition or in the alternative, the remote computing sites may include other user equipment devices, such as user television equipment 502, user computer equipment 504, and wireless user communications device 506. For example, the other user equipment devices may provide access to a stored copy of a video or a streamed video. In such embodiments, user equipment devices may operate in a peer-to-peer manner without communicating with a central server.

The cloud provides access to services, such as content storage, content sharing, or social networking services, among other examples, as well as access to any content described above, for user equipment devices. Services can be provided in the cloud through cloud computing service providers, or through other providers of online services. For example, the cloud-based services can include a content storage service, a content sharing site, a social networking site, or other services via which user-sourced content is distributed for viewing by others on connected devices. These cloud-based services may allow a user equipment device to store content to the cloud and to receive content from the cloud rather than storing content locally and accessing locally-stored content.

A user may use various content capture devices, such as camcorders, digital cameras with video mode, audio recorders, mobile phones, and handheld computing devices, to record content. The user can upload content to a content storage service on the cloud either directly, for example, from user computer equipment 504 or wireless user communications device 506 having content capture feature. Alternatively, the user can first transfer the content to a user equipment device, such as user computer equipment 504. The user equipment device storing the content uploads the content to the cloud using a data transmission service on communications network 514. In some embodiments, the user equipment device itself is a cloud resource, and other user equipment devices can access the content directly from the user equipment device on which the user stored the content.

Cloud resources may be accessed by a user equipment device using, for example, a web browser, a media guidance application, a desktop application, a mobile application, and/or any combination of access applications of the same. The user equipment device may be a cloud client that relies on cloud computing for application delivery, or the user equipment device may have some functionality without access to cloud resources. For example, some applications running on the user equipment device may be cloud applications, i.e., applications delivered as a service over the Internet, while other applications may be stored and run on the user equipment device. In some embodiments, a user device may receive content from multiple cloud resources simultaneously. For example, a user device can stream audio from one cloud resource while downloading content from a second cloud resource. Or a user device can download content from multiple cloud resources for more efficient downloading. In some embodiments, user equipment devices can use cloud resources for processing operations such as the processing operations performed by processing circuitry described in relation to FIG. 4.

As referred herein, the term "in response to" refers to initiated as a result of. For example, a first action being performed in response to a second action may include interstitial steps between the first action and the second action. As referred herein, the term "directly in response to" refers to caused by. For example, a first action being performed directly in response to a second action may not include interstitial steps between the first action and the second action.

FIG. 6 is a flowchart of detailed illustrative process 600 for setting the volume level of the audio of a voice communications link in accordance with some embodiments in the disclosure. It should be noted that process 600 or any step thereof could be performed on, or provided by, any of the devices shown in FIGS. 4-5. For example, process 600 may be executed by control circuitry 404 (FIG. 4) as instructed by a media guidance application implemented on a user device (e.g., user equipment devices 502, 504, and/or 506 (FIG. 5)) in order to manage user device volume levels. In addition, one or more steps of process 600 may be incorporated into or combined with one or more steps of any other process or embodiment described herein.

At step 610, a media asset is accessed using a first user device, the first user device being associated with a first user at a first location. For example, control circuitry 404 may receive user input requesting access to the television show "Saturday Night Live" from the user's television remote control in the user's living room. In response to receiving the user request, control circuitry 404 may access the latest episode of "Saturday Night Live" through cable network 516 and provide it to the user on television display 102.

At step 620, a second user who is accessing the media asset using a second user device is identified, wherein the second user is associated with the first user and is at a second location. For example, control circuitry 404 may search the first user's contacts list retrieved from storage 408 for users associated with the first user. Control circuitry 404 may communicate with a remote server to identify what media assets are being accessed by the user devices of the users associated with the first user. For example, control circuitry 404 may identify a second user that is also watching "Saturday Night Live" on a tablet computer device in the second user's bedroom.

At step 630, a voice communications link between the first and second user devices that enables the first and second users to speak to each other while accessing the media asset is established. For example, the first user may be connected to a Google Home device in their living room as they watch "Saturday Night Live" on their television. The second user may be connected to an Amazon Echo device in their bedroom as they watch "Saturday Night Live" on their tablet computer device. After identifying the second user, control circuitry 404 may retrieve the second user's contact information from storage 408 and transmit a request to the second user device to establish a voice communications link between the first and second user. Control circuitry 404 may request authorization to establish the voice communications link from the second user by showing a prompt on the second user's tablet computer device's display 412 or by making an audible request that is outputted on the speakers 414 of the second user's tablet computer device. In response to authorization from the second user to establish the voice communications link, control circuitry 404 may connect the first and second users over a real-time connection with which the user devices are continuously transmitting audio to each other and playing back received audio on user device speakers 414.

At step 640, a volume level of audio received via the voice communications link is set based on the content of the media asset. For example, control circuitry 404 may process the current content of the "Saturday Night Live" episode by using speech recognition and machine learning algorithms to identify keywords from the audio of the episode. Control circuitry 404 may use these keywords to determine a first content attribute of the media asset and query a remote or local database to determine what the volume level of the voice communications link should be set to based on the first content attribute. For example, the first content attribute may indicate that the content is comedic. Control circuitry 404 may determine from querying a database that the volume of the audio of the voice communications link on the user's Google Home device 108 should be set to volume "5" when the user is accessing comedic content.

At step 650, the audio received via the voice communications link from the second user is presented to the first user at the set volume level. For example, after determining that the volume of the audio received via the voice communications link should be set to volume "5", control circuitry 404 may set the volume level of the speakers 110 of the first user's Google Home device 108 to volume "5".

It is contemplated that the steps or descriptions of FIG. 6 may be used with any other embodiment of this disclosure. In addition, the steps and descriptions described in relation to FIG. 6 may be done in alternative orders or in parallel to further the purposes of this disclosure. For example, each of these steps may be performed in any order or in parallel or substantially simultaneously to reduce lag or increase the speed of the system or method. Any of these steps may also be skipped or omitted from the process. Furthermore, it should be noted that any of the devices or equipment discussed in relation to FIGS. 4-5 could be used to perform one or more of the steps in FIG. 6.

Figure 7:
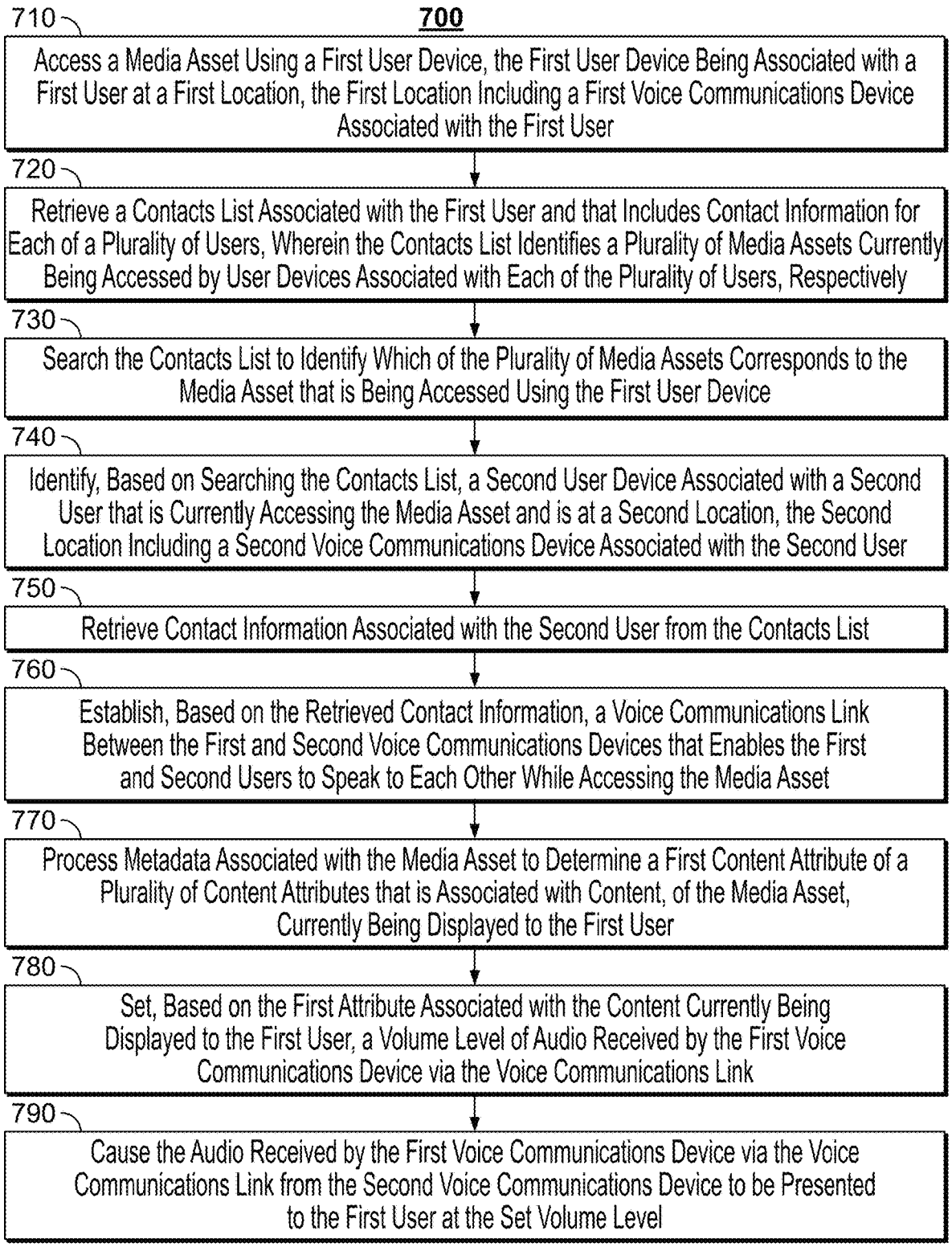
FIG. 7 is a flowchart of a detailed illustrative process for determining and using a first content attribute of the content of the media asset currently being displayed in accordance with some embodiments in the disclosure.

FIG. 7 is a flowchart of detailed illustrative process 700 for determining and using a first content attribute of the content of the media asset currently being displayed in accordance with some embodiments of the disclosure. It should be noted that process 700 or any step thereof could be performed on, or provided by, any of the devices shown in FIGS. 4-5. For example, process 700 may be executed by control circuitry 404 (FIG. 4) as instructed by a media guidance application implemented on a user device (e.g., user equipment devices 502, 504, and/or 506 (FIG. 5)) in order to determine and use a first content attribute associated with a media asset. In addition, one or more steps of process 700 may be incorporated into or combined with one or more steps of any other process or embodiment described herein.

At step 710, a media asset is accessed using a first user device, the first user device being associated with a first user at a first location, the first location including a first voice communications device associated with the first user. For example, control circuitry 404 may receive user input requesting access to the television show "Saturday Night Live" from the user's television remote control in the user's living room, where the user's Google Home device is also located. In response to receiving the user request, control circuitry 404 may access the latest episode of "Saturday Night Live" through cable network 516 and provide it to the user on television display 102.

At step 720, a contacts list associated with the first user and that includes contact information for each of a plurality of users is retrieved, wherein the contacts list identifies a plurality of media assets currently being accessed by user devices associated with each of the plurality of users, respectively. For example, control circuitry 404 may retrieve, from a database or storage 308, a contacts list associated with the first user and that includes associated users' contact information and media assets currently being accessed by their associated user devices. For example, control circuitry 404 may retrieve a contacts list including a second user who is watching "Saturday Night Live" on a tablet computer device and a third user who is watching a basketball game on a mobile phone device.

At step 730, the contacts list is searched to identify which of the plurality of media assets corresponds to the media asset that is being accessed using the first user device. For example, control circuitry 404 may iterate through each entry of the contacts list and identify whether each media asset being accessed in the entry is a match for "Saturday Night Live."

At step 740, based on searching the contacts list, a second user device associated with a second user that is currently accessing the media asset and is at a second location is identified, the second location including a second voice communications device associated with the second user. For example, after identifying a match for "Saturday Night Live" as the media asset being accessed, control circuitry 404 may identify a second user watching "Saturday Night Live" on their tablet computer device in their bedroom, where there Amazon Echo device is also located.

At step 750, contact information associated with the second user from the contacts list is retrieved. For example, control circuitry 404 may retrieve from the first user's contacts list the network address of the second user's Amazon Echo device by which the second user may be reached via a call or voice communications link.

At step 760, based on the retrieved contact information, a voice communications link between the first and second voice communications devices that enables the first and second users to speak to each other while accessing the media asset is established. For example, control circuitry 404 may transmit a request to the second user's Amazon Echo device to establish a voice communications link between the first and second user. Control circuitry 404 may request authorization to establish the voice communications link from the second user by showing a prompt on the second user's tablet computer device's display 412 or making an audible request that is outputted on the second user's tablet computer device's speakers 414. In response to authorization from the second user to establish the voice communications link, control circuitry 404 may connect the first and second user over a real-time connection with which the first user's Google Home device and the second user's Amazon Echo device are continuously transmitting audio to each other and playing back received audio on user device speakers 414.

At step 770, metadata associated with the media asset is processed to determine a first content attribute of a plurality of content attributes that is associated with content of the media asset currently being displayed to the first user. For example, control circuitry 404 may process the current content of the "Saturday Night Live" episode by using speech recognition and machine learning algorithms to identify keywords from the audio of the episode. For example, the first content attribute may indicate that the content is comedic.

At step 780, based on the first attribute associated with the content currently being displayed to the first user, a volume level of audio received by the first voice communications device via the voice communications link is set. For example, control circuitry 404 may determine from querying a database that the volume of the audio of the voice communications link on the user's Google Home device 108 should be set to volume "5" when the user is accessing comedic content.

At step 790, the audio received by the first voice communications device via the voice communications link from the second voice communications device is presented to the first user at the set volume level. For example, after determining that the volume of the audio received via the voice communications link should be set to volume "5", control circuitry 404 may set the volume level of the speakers 110 of the first user's Google Home device 108 to volume "5".

It is contemplated that the steps or descriptions of FIG. 7 may be used with any other embodiment of this disclosure. In addition, the steps and descriptions described in relation to FIG. 7 may be done in alternative orders or in parallel to further the purposes of this disclosure. For example, each of these steps may be performed in any order or in parallel or substantially simultaneously to reduce lag or increase the speed of the system or method. Any of these steps may also be skipped or omitted from the process. Furthermore, it should be noted that any of the devices or equipment discussed in relation to FIGS. 4-5 could be used to perform one or more of the steps in FIG. 7.

Figure 8:
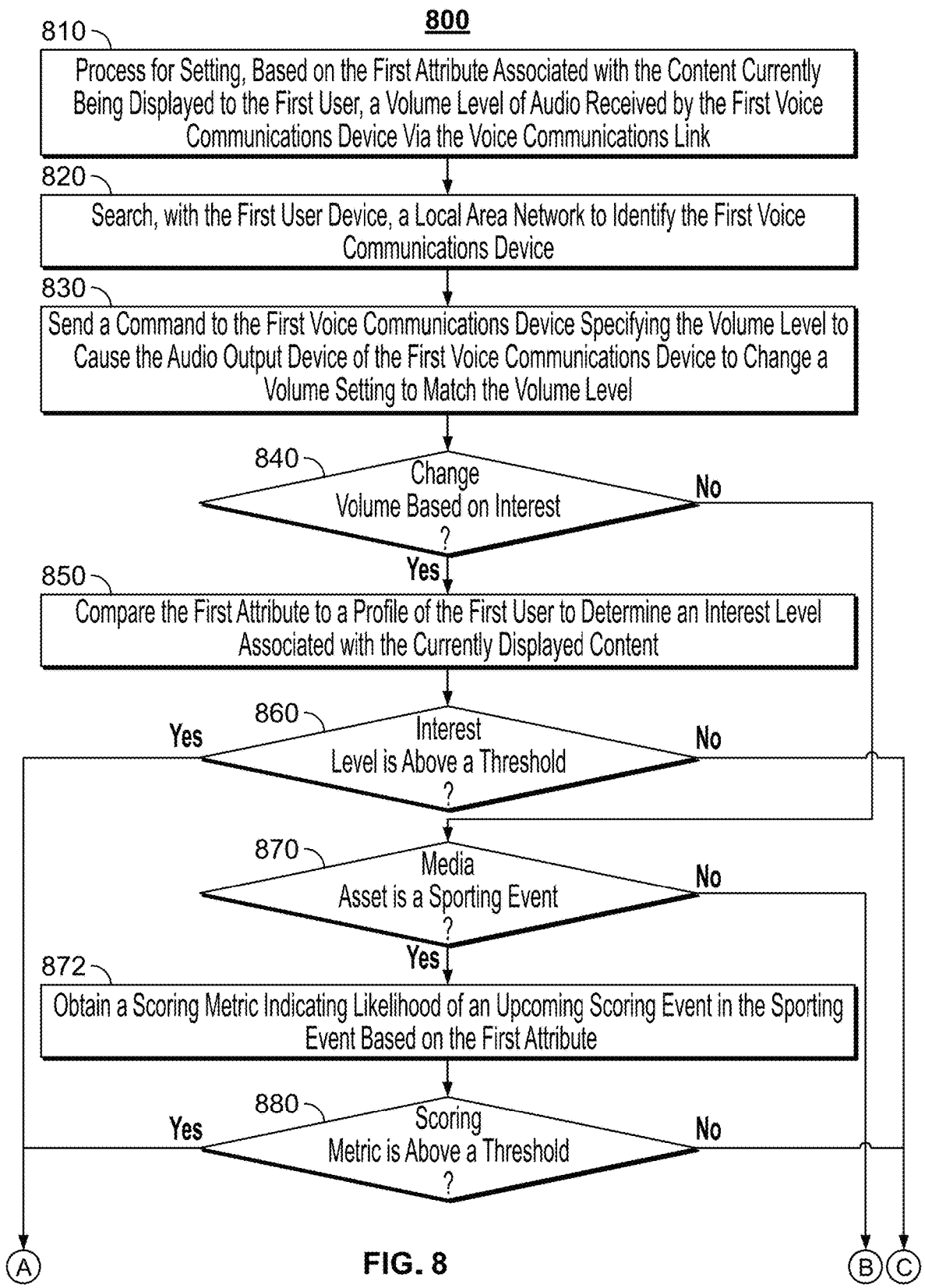
FIG. 8 is a flowchart of a detailed illustrative process for changing the volume of a voice communications link on a voice communications device in accordance with some embodiments in the disclosure.
Figure 8:
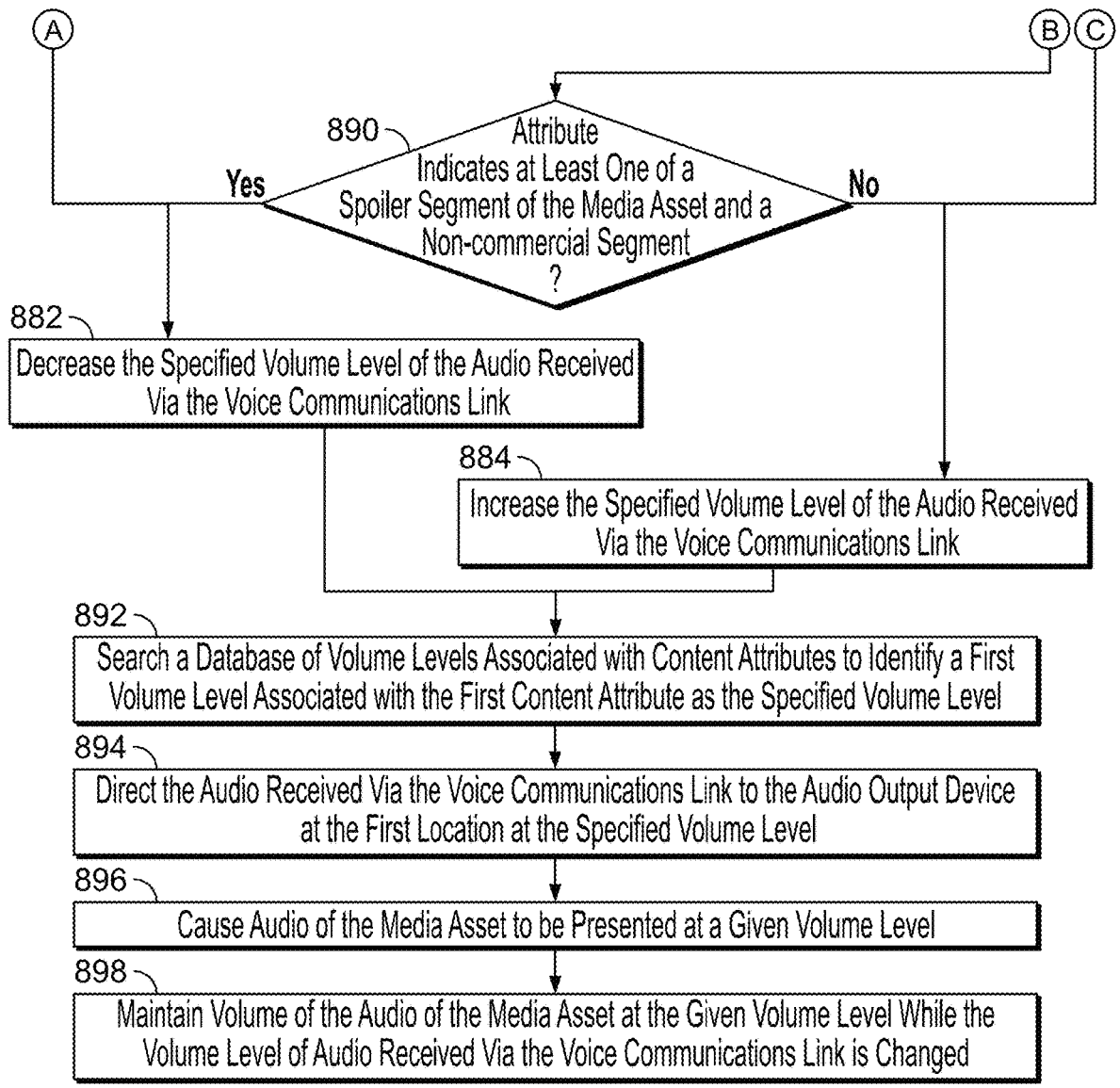

FIG. 8 is a flowchart of detailed illustrative process 800 for changing the volume of a voice communications link on a voice communications device in accordance with some embodiments of the disclosure. It should be noted that process 800 or any step thereof could be performed on, or provided by, any of the devices shown in FIGS. 4-5. For example, process 800 may be executed by control circuitry 404 (FIG. 4) as instructed by a media guidance application implemented on a user device (e.g., user equipment devices 502, 504, and/or 506 (FIG. 5)) in order to manage volume level of a voice communications link. In addition, one or more steps of process 800 may be incorporated into or combined with one or more steps of any other process or embodiment described herein.

At step 810, based on the first attribute associated with the content currently being displayed to the first user, a volume level of audio received by the first voice communications device via the voice communications link is set. For example, control circuitry 404 may determine during an episode of "Saturday Night Live" a first content attribute indicating comedic content. Control circuitry may set, from the first content attribute, the volume of a user's Google Home device to volume "5".

At step 820, a local area network is searched with the first user device to identify the first voice communications device. For example, control circuitry 404 may issue a discovery request to a local network associated with the first user's television remote control device. Each device coupled to the network may respond with parameters identifying the device. Control circuitry 404 may receive responses from the first user's Google Home device and the first user's mobile phone device that include location information for each device. Control circuitry 404 may use this location information to determine whether the Google Home device or the mobile phone device is closer to the first user device. Control circuitry 404 may compare signal attenuation from the discovered devices to determine which device is closer to the first user device. The media guidance application may, upon determining that the Google Home device is closer to the first user's television remote control device, select the Google Home device as the first user communications device.

At step 830, a command specifying the volume level is sent to the first voice communications device to cause the audio output device of the first voice communications device to change a volume setting to match the volume level. For example, control circuitry 404 may send a command indicating volume level "5" to the first user's Google Home device 108 that causes the device to change the volume 112 of its speakers 110 to match the volume level indicated by the command.

At step 840, a determination is made as to whether the volume should be changed based on interest. In response to determining that the volume should be changed based on interest, the process proceeds to step 850. Otherwise, the process proceeds to step 870. For example, control circuitry 404 may use machine learning algorithms to determine a confidence level associated with the first content attribute. If this confidence level is above a threshold retrieved from storage 408, the media guidance application may determine that the volume should be changed based on interest. If the confidence level is below the threshold, the media guidance application may determine that interest level cannot be adequately determined and that the volume should not be changed based on interest.

At step 850, the first attribute is compared to a profile of the first user to determine an interest level associated with the currently displayed content. For example, control circuitry 404 may retrieve a profile of the first user from storage 308 and use machine learning algorithms to determine the user's interest level in comedic content.

At step 860, a determination is made as to whether the interest level is above a threshold. In response to determining that the interest level is above a threshold, the process proceeds to step 890. Otherwise, the process proceeds to step 884. For example, the threshold may be set by default to a numeric value within a range and adjusted manually by the user via an application user interface. The threshold may be stored in a database that can be queried by the media guidance application.

At step 870, a determination is made as to whether the media asset is a sporting event. In response to determining that the media asset is a sporting event, the process proceeds to step 872. Otherwise, the process proceeds to step 890. For example, if the media asset being accessed is an episode of "Saturday Night Live" and the first content attribute indicates comedic content, control circuitry 404 may query a database of content attributes that indicate a sporting event for the first content attribute indicating comedic content and, upon not finding a match, determine that the episode of "Saturday Night Live" is not a sporting event. In another example, if the media asset being accessed is a basketball game and the first content attribute is "basketball," control circuitry 404 may query a database of content attributes that indicate a sporting event for the content attribute "basketball" and, upon finding a match, determine that the media asset is a sporting event.

At step 872, a scoring metric indicating likelihood of an upcoming scoring event in the sporting event based on the first attribute is obtained. For example, control circuitry 404 may use speech recognition and machine learning algorithms to analyze the audio of the sporting event, such as commentary by the sports announcers, and generate a numeric scoring metric indicating likelihood of an upcoming scoring event.

At step 880, a determination is made as to whether the scoring metric is above a threshold. In response to determining that the scoring metric is above a threshold, the process proceeds to step 882. Otherwise, the process proceeds to step 884. For example, the threshold may be set by default to a numeric value within a range and adjusted manually by the user via an application user interface. The threshold may be stored in a database that can be queried by the media guidance application.

At step 882, the specified volume level of the audio received via the voice communications link is decreased. For example, control circuitry 404 may transmit a command to the first user's Google Home device 108 to decrease the volume level of the audio received via the voice communications link.

At step 884, the specified volume level of the audio received via the voice communications link is increased. For example, control circuitry 404 may transmit a command to the first user's Google Home device 108 to increase the volume level of the audio received via the voice communications link.

At step 890, a determination is made as to whether the attribute indicates at least one of a spoiler segment of the media asset and a non-commercial segment. In response to determining that the attribute indicates at least one of a spoiler segment of the media asset and a non-commercial segment, the process proceeds to step 882. Otherwise, the process proceeds to step 884. For example, control circuitry 404 may search for the identified first content attribute indicating comedic content in a database of content attributes that indicate at least one of a spoiler segment and a non-commercial segment and determine whether there is a match.

At step 892, a database of volume levels associated with content attributes is searched to identify a first volume level associated with the first content attribute as the specified volume level. For example, control circuitry 404 may search a database of volume levels retrieved from storage 308 to identify a first volume level for a Google Home device of volume "5" associated with a first content attribute indicating comedic content.

At step 894, the audio received via the voice communications link is directed to the audio output device at the first location at the specified volume level. For example, control circuitry 404 may direct the audio received via the voice communications link connected to by the Google Home device 108 to the Google Home device's speakers 110 at a specified volume level of "5".

At step 896, the audio of the media asset is presented at a given volume level. For example, control circuitry 404 may set the volume level of the first user's television displaying "Saturday Night Live" to a given volume level of volume "15".

At step 898, the volume of the audio of the media asset is maintained at the given volume level while the volume level of audio received via the voice communications link is changed. For example, control circuitry 404 may transmit a command to maintain the volume level of the television at volume "15" while transmitting a command to change the volume level of Google Home device's speakers 110 from volume "5" to volume "7".

It is contemplated that the steps or descriptions of FIG. 8 may be used with any other embodiment of this disclosure. In addition, the steps and descriptions described in relation to FIG. 8 may be done in alternative orders or in parallel to further the purposes of this disclosure. For example, each of these steps may be performed in any order or in parallel or substantially simultaneously to reduce lag or increase the speed of the system or method. Any of these steps may also be skipped or omitted from the process. Furthermore, it should be noted that any of the devices or equipment discussed in relation to FIGS. 4-5 could be used to perform one or more of the steps in FIG. 8.

Figure 9:
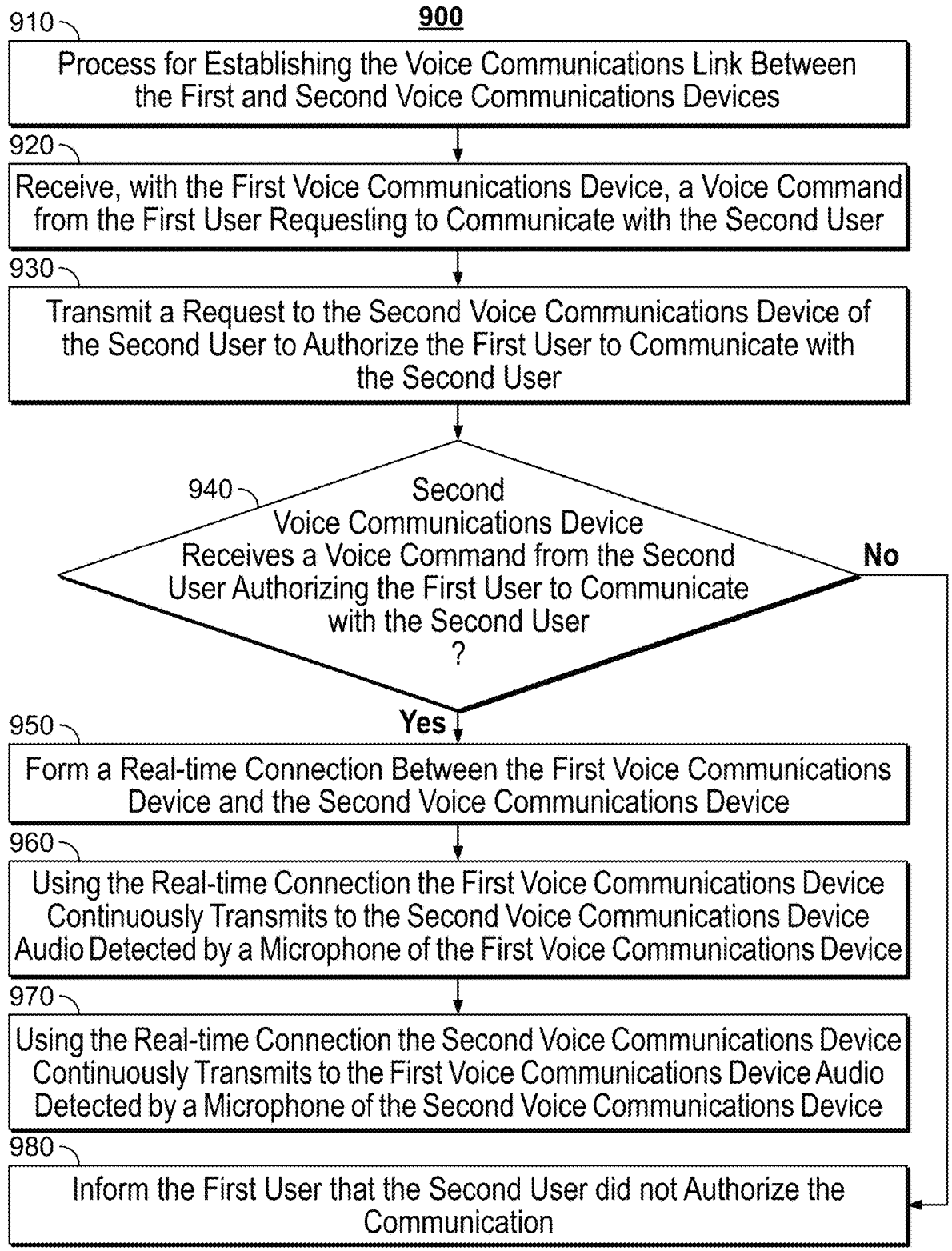
FIG. 9 is a flowchart of a detailed illustrative process for establishing a voice communications link between a first and second voice communications device in accordance with some embodiments in the disclosure.

FIG. 9 is a flowchart of detailed illustrative process 900 for establishing a voice communications link between a first and second voice communications device in accordance with some embodiments of the disclosure. It should be noted that process 900 or any step thereof could be performed on, or provided by, any of the devices shown in FIGS. 4-5. For example, process 900 may be executed by control circuitry 404 (FIG. 4) as instructed by a media guidance application implemented on a user device (e.g., user equipment devices 502, 504, and/or 506 (FIG. 5)) in order to manage voice communications links. In addition, one or more steps of process 900 may be incorporated into or combined with one or more steps of any other process or embodiment described herein.

At step 910, a voice communications link between the first and second voice communications devices is established. For example, control circuitry 404 may detect through the first user device's microphone a voice request from the first user to communicate with the second user. Control circuitry 404 may retrieve the second user's contact information from storage 408 and transmit a request to the second user device to establish a voice communications link between the first and second user. Control circuitry 404 may request authorization to establish the voice communications link from the second user by showing a prompt on the second user device's display 412 or making an audible request that is outputted on the second user device's speakers 414. In response to authorization from the second user to establish the voice communications link, control circuitry 404 may connect the first and second user over a real-time connection with which the user devices are continuously transmitting audio to each other and playing back received audio on user device speakers 414.

At step 920, a voice command from the first user requesting to communicate with the second user is received with the first voice communications device. For example, control circuitry 404 may detect through the microphone of the first user's Google Home device a voice command from the first user requesting to communicate with the second user.

At step 930, a request to the second voice communications device of the second user to authorize the first user to communicate with the second user is transmitted. For example, control circuitry 404 may request authorization to establish the voice communications link from the second user by showing a prompt on the second user's tablet computer device's display or making an audible request that is outputted on the speakers of the second user's tablet computer device.

At step 940, a determination is made as to whether the second voice communications device receives a voice command from the second user authorizing the first user to communicate with the second user. In response to determining that the second voice communications device has received a voice command from the second user authorizing the first user to communicate with the second user, the process proceeds to step 950. Otherwise, the process proceeds to step 980. For example, control circuitry 404 may detect through the microphone of the second user's tablet computer device a voice command by the second user. Control circuitry 404 may use speech recognition algorithms to determine whether this voice command is authorizing the first user to communicate with the second user.

At step 950, a real-time connection between the first voice communications device and the second voice communications device is formed. For example, control circuitry 404 may form a real-time connection between the first user's Google Home device and the second user's Amazon Echo device.

At step 960, using the real-time connection, audio detected by a microphone of the first voice communications device is continuously transmitted by the first voice communications device to the second voice communications device. For example, control circuitry 404 may record the audio detected by the microphone of the first user's Google Home device in 10 millisecond intervals and transmit each recording continuously to the second user's Amazon Echo device.

At step 970, using the real-time connection, audio detected by a microphone of the second voice communications device is continuously transmitted by the second voice communications device to the first voice communications device. For example, control circuitry 404 may record the audio detected by the microphone of the second user's Amazon Echo device in 10 millisecond intervals and transmit each recording continuously to the first user's Google Home device.

At step 980, the first user is informed that the second user did not authorize the communication. For example, control circuitry 404 may notify the first user that the second user did not authorize the communication by showing a prompt on the first user's television display or issuing a verbal notification that is outputted on the speakers 110 of the first user's Google Home device or the speakers of the first user's television 102.

It is contemplated that the steps or descriptions of FIG. 9 may be used with any other embodiment of this disclosure. In addition, the steps and descriptions described in relation to FIG. 9 may be done in alternative orders or in parallel to further the purposes of this disclosure. For example, each of these steps may be performed in any order or in parallel or substantially simultaneously to reduce lag or increase the speed of the system or method. Any of these steps may also be skipped or omitted from the process. Furthermore, it should be noted that any of the devices or equipment discussed in relation to FIGS. 4-5 could be used to perform one or more of the steps in FIG. 9.

Figure 10:
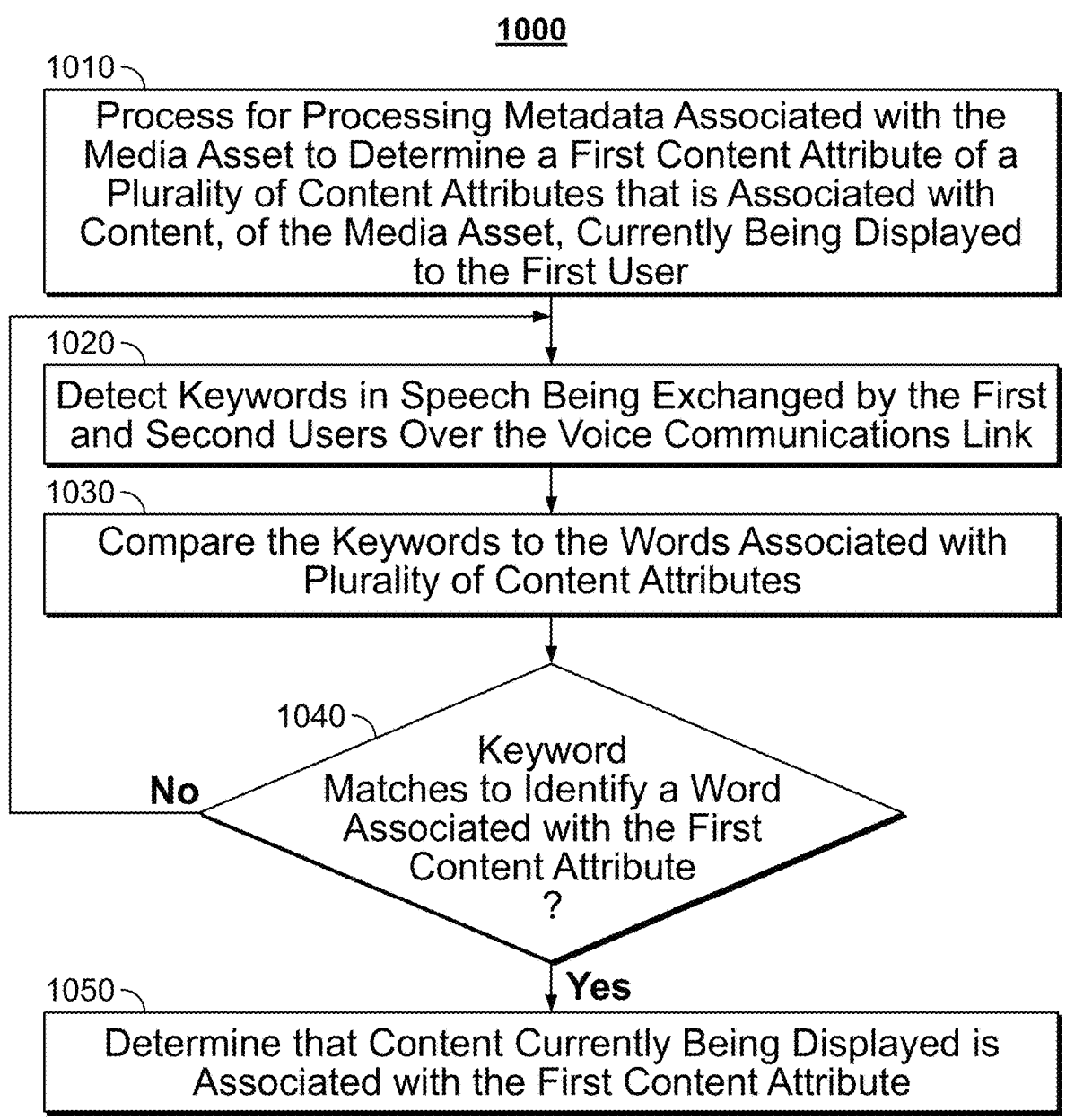
FIG. 10 is a flowchart of a detailed illustrative process for comparing keywords in speech exchanged by users via the voice communications link to the first content attribute of the media asset currently being displayed to the first user in accordance with some embodiments in the disclosure.

FIG. 10 is a flowchart of detailed illustrative process 1000 for comparing keywords in speech exchanged by users via the voice communications link to the first content attribute of the media asset currently being displayed to the first user in accordance with some embodiments of the disclosure. It should be noted that process 1000 or any step thereof could be performed on, or provided by, any of the devices shown in FIGS. 4-5. For example, process 1000 may be executed by control circuitry 404 (FIG. 4) as instructed by a media guidance application implemented on a user device (e.g., user equipment devices 502, 504, and/or 506 (FIG. 5)) in order to manage keywords and content attributes. In addition, one or more steps of process 1000 may be incorporated into or combined with one or more steps of any other process or embodiment described herein.

At step 1010, metadata associated with the media asset is processed to determine a first content attribute of a plurality of content attributes that is associated with content of the media asset currently being displayed to the first user. For example, control circuitry 404 may process the audio content of a "Saturday Night Live" episode by using speech recognition and machine learning algorithms to identify keywords from which a first content attribute of the episode is determined to be comedic content.

At step 1020, keywords in speech being exchanged by the first and second users over the voice communications link are detected. For example, control circuitry 404 may process the audio detected by the microphones on the first user's Google Home device and the second user's Amazon Echo device and use speech recognition and machine learning algorithms to identify keywords.

At step 1030, the keywords are compared to the words associated with the plurality of content attributes. For example, control circuitry 404 may query a database in storage 308 that stores a plurality of content attributes and compare the keywords to the database entries.

At step 1040, a determination is made as to whether the keyword matches to identify a word associated with the first content attribute. In response to determining that the keyword matches to identify a word associated with the first content attribute, the process proceeds to step 1050. Otherwise, the process proceeds to step 1020. For example, control circuitry 404 may compare each keyword to each word associated with the first content attribute indicating comedic content in order to determine a match.

At step 1050, the content currently being displayed is determined to be associated with the first content attribute. For example, control circuitry 404 may determine that that the content currently being displayed in a "Saturday Night Live" episode is associated with the first content attribute indicating comedic content.

It is contemplated that the steps or descriptions of FIG. 10 may be used with any other embodiment of this disclosure. In addition, the steps and descriptions described in relation to FIG. 10 may be done in alternative orders or in parallel to further the purposes of this disclosure. For example, each of these steps may be performed in any order or in parallel or substantially simultaneously to reduce lag or increase the speed of the system or method. Any of these steps may also be skipped or omitted from the process. Furthermore, it should be noted that any of the devices or equipment discussed in relation to FIGS. 4-5 could be used to perform one or more of the steps in FIG. 10.

The above-described embodiments of the present disclosure are presented for purposes of illustration and not of limitation, and the present disclosure is limited only by the claims which follow. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. It should also be noted, the systems and/or methods described above may be applied to, or used in accordance with, other systems and/or methods.

What is claimed is:

1. A method for establishing a voice communications link between multiple users who are accessing a media asset, comprising:
   accessing the media asset using a first user device, the first user device being at a first location;
   identifying a second user device accessing the media asset while the media asset is also being accessed using the first user device, wherein the second user device is at a second location;
   establishing the voice communications link between the first and second user devices while accessing the media asset;
   determining a content attribute associated with the media asset;
   automatically, setting, based on the content attribute of the media asset, a volume level of audio received via the voice communications link; and
   causing the audio received via the voice communications link from the second user device to be presented to the first user device at the set volume level.

2. The method of claim 1, further comprising:
selecting a first voice communications device associated with the first user device based on proximity of the first voice communications device to the first user device.

3. The method of claim 2, further comprising:
selecting a second voice communications device associated with the second user device based on proximity of the second voice communications device to the second user device.

4. The method of claim 3, wherein causing the audio received via the voice communications link from the second user device to be presented to the first user device at the set volume level further comprises causing the audio received from the second voice communications device via the voice communications link to be presented to the first user device at the set volume level.

5. The method of claim 2, wherein the first voice communications device includes an audio output device, wherein setting the volume level comprises:
searching, with the first user device, a local area network to identify the first voice communications device;
sending a command to the first voice communications device specifying the volume level to cause the audio output device of the first voice communications device to change a volume setting to match the volume level; and
directing the audio received via the voice communications link to the audio output device at the first location.

6. The method of claim 3, wherein the first and second voice communications devices each includes a voice response system that receives verbal commands and responds to the verbal commands audibly.

7. The method of claim 1, wherein identifying the second user device further comprises:
retrieving a contacts list of plurality of media assets currently being accessed by a plurality of user devices;
searching the contacts list to identify which of the plurality of media assets corresponds to the media asset that is being accessed using the first user device; and
selecting, based on searching the contacts list, the second user device that is accessing the media asset from the second location while the media asset is also being accessed using the first user device.

8. The method of claim 7, further comprising transmitting a request to the second user device to establish the voice communication link with the first user device.

9. The method of claim 1, wherein accessing the media asset using the first user device comprises causing audio of the media asset to be presented at a given volume level, and wherein causing the audio received via the voice communications link from the second user device to be presented to the first user device at the set volume level comprises:
changing the volume level of audio received via the voice communications link that is presented to the first user device; and
maintaining volume of the audio of the media asset at the given volume level while the volume level of audio received via the voice communications link is changed.

10. The method of claim 1, further comprising causing to lower the volume level of the audio of the voice communications link established at the first user device while simultaneously causing to increase the volume level of the audio of the voice communications link established at the second user device.

11. A system for establishing a voice communications link between multiple users who are accessing a media asset comprising:
input/output (I/O) circuitry configured to provide the media asset to a plurality of user devices;
control circuitry communicably coupled to the I/O circuitry and configured to:
access the media asset using a first user device of the plurality of user devices, the first user device being at a first location;
identify a second user device of the plurality of user devices accessing the media asset while the media asset is also being accessed using the first user device, wherein the second user device is at a second location;
establish the voice communications link between the first and second user devices while accessing the media asset;
determine a content attribute associated with the media asset;
automatically, set, based on the content attribute of the media asset, a volume level of audio received via the voice communications link; and
cause the audio received via the voice communications link from the second user device to be presented to the first user device at the set volume level.

12. The system of claim 11, wherein the control circuitry is further configured to:
select a first voice communications device associated with the first user device based on proximity of the first voice communications device to the first user device.

13. The system of claim 12, wherein the control circuitry is further configured to:
select a second voice communications device associated with the second user device based on proximity of the second voice communications device to the second user device.

14. The system of claim 13, wherein the control circuitry is configured to cause the audio received via the voice communications link from the second user device to be presented to the first user device at the set volume level further by causing the audio received from the second voice communications device via the voice communications link to be presented to the first user device at the set volume level.

15. The system of claim 12, wherein the first voice communications device includes an audio output device, and wherein to set the volume level the control circuitry is further configured to:
search, with the first user device, a local area network to identify the first voice communications device;
send a command to the first voice communications device specifying the volume level to cause the audio output device of the first voice communications device to change a volume setting to match the volume level; and
direct the audio received via the voice communications link to the audio output device at the first location.

16. The system of claim 13, wherein the first and second voice communications devices each includes a voice response system that receives verbal commands and responds to the verbal commands audibly.

17. The system of claim 11, wherein to identify the second user device, the control circuitry is further configured to:
retrieve a contacts list of plurality of media assets currently being accessed by the plurality of user devices;
search the contacts list to identify which of the plurality of media assets corresponds to the media asset that is being accessed using the first user device; and
select, based on searching the contacts list, the second user device that is accessing the media asset from the second location while the media asset is also being accessed using the first user device.

18. The system of claim 17, wherein the control circuitry is further configured to transmit a request to the second user device to establish the voice communication link with the first user device.

19. The system of claim 11, wherein to access the media asset using the first user device, the control circuitry is configured to cause audio of the media asset to be presented at a given volume level, and wherein to cause the audio received via the voice communications link from the second user device to be presented to the first user device at the set volume level, the control circuitry is configured to:
  change the volume level of audio received via the voice communications link that is presented to the first user device; and
  maintain volume of the audio of the media asset at the given volume level while the volume level of audio received via the voice communications link is changed.

20. The system of claim 11, wherein the control circuitry is configured to cause to lower the volume level of the audio of the voice communications link established at the first user device while simultaneously causing to increase the volume level of the audio of the voice communications link established at the second user device.

* * * * *